(12) United States Patent
Mitsuya

(10) Patent No.: US 8,138,505 B2
(45) Date of Patent: Mar. 20, 2012

(54) LIGHT-EMITTING DEVICE, DISPLAY APPARATUS, AND ELECTRONIC SYSTEM

(75) Inventor: Masayuki Mitsuya, Chino (JP)

(73) Assignee: Seiko Epson Corporation, Tokyo (JP)

( * ) Notice: Subject to any disclaimer, the term of this patent is extended or adjusted under 35 U.S.C. 154(b) by 164 days.

(21) Appl. No.: 12/467,544

(22) Filed: May 18, 2009

(65) Prior Publication Data
US 2009/0294778 A1 Dec. 3, 2009

(30) Foreign Application Priority Data

Jun. 2, 2008 (JP) .................. 2008-145169
Jun. 2, 2008 (JP) .................. 2008-145170

(51) Int. Cl.
*H01L 33/00* (2010.01)
(52) U.S. Cl. ....... 257/79; 257/40; 257/98; 257/E33.001; 257/E33.061; 313/504; 313/506
(58) Field of Classification Search ......... 257/79, 257/89, 98, 40, E33.001, E33.061, E33.067; 313/504, 506, 110
See application file for complete search history.

(56) References Cited

U.S. PATENT DOCUMENTS

| | | | |
|---|---|---|---|
| 8,026,662 B2 | 9/2011 | Ishihara et al. | |
| 2009/0091250 A1* | 4/2009 | Yasukawa et al. | 313/504 |

FOREIGN PATENT DOCUMENTS

| | | |
|---|---|---|
| JP | A-2005-285708 | 10/2005 |
| JP | A-2007-287691 | 11/2007 |
| JP | A-2007-299645 | 11/2007 |
| JP | A-2009-64605 | 3/2009 |
| JP | A-2009-76528 | 4/2009 |
| JP | A-2009-76793 | 4/2009 |

OTHER PUBLICATIONS

Translation of JP2009093810.*

* cited by examiner

*Primary Examiner* — Victor A Mandala
*Assistant Examiner* — Whitney T Moore
(74) *Attorney, Agent, or Firm* — Oliff & Berridge, PLC

(57) ABSTRACT

A light-emitting device includes a cathode, an anode, a first light-emitting layer that is disposed between the cathode and the anode and that emits light of a first color, a second light-emitting layer that is disposed between the first light-emitting layer and the cathode and that emits light of a second color different from the first color, and an intermediate layer that is disposed between and in contact with the first light-emitting layer and the second light-emitting layer and that contains a first material and a second material different from the first material. The light-emitting device satisfies inequality (1):

$$LL_A - LL_B \geq 0.4 \text{ [eV]} \quad (1)$$

wherein $LL_A$ [eV] is the energy level of the lowest unoccupied molecular orbital of the first material, and $LL_B$ [eV] is the energy level of the lowest unoccupied molecular orbital of the second material.

17 Claims, 4 Drawing Sheets

LIGHT

LIGHT

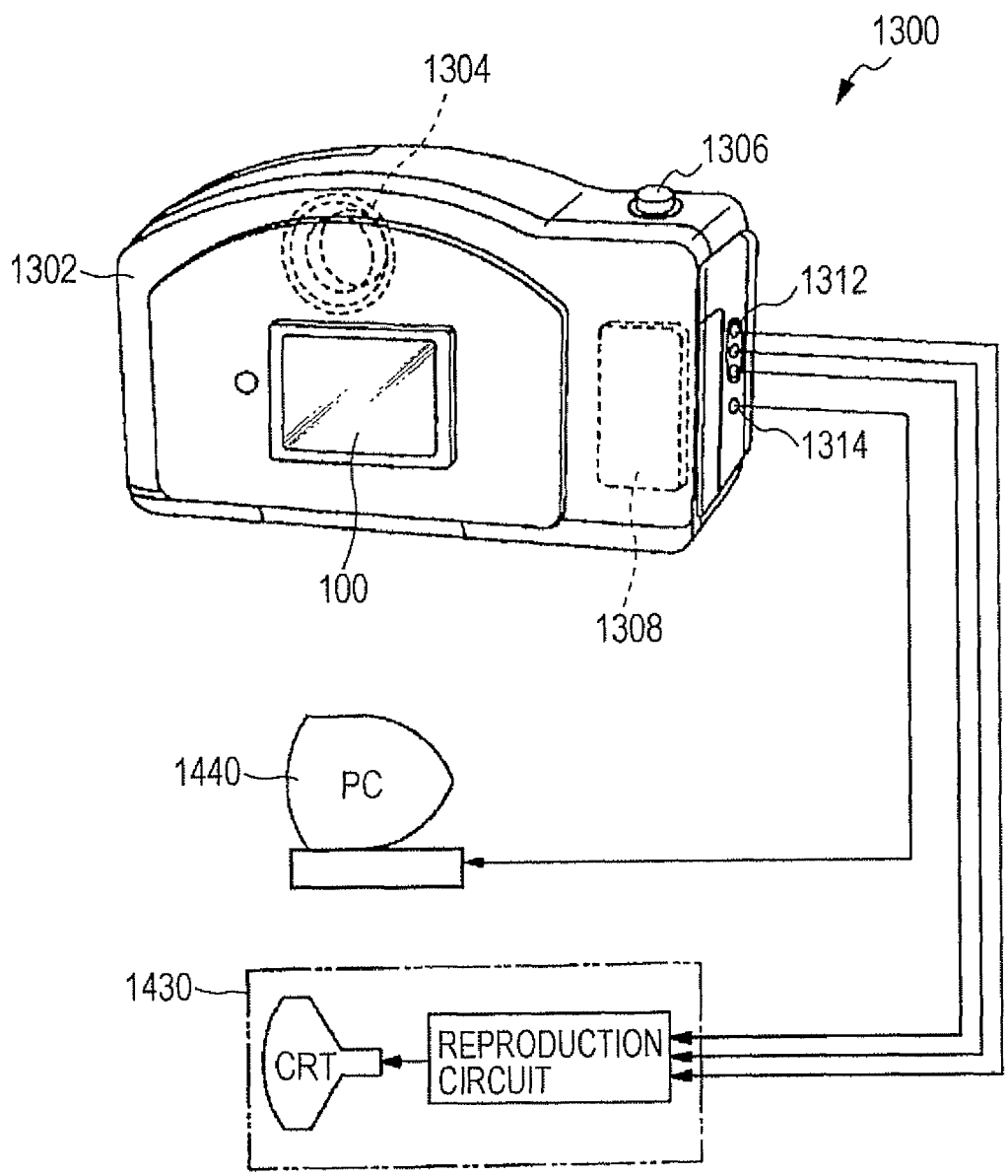

LIGHT-EMITTING DEVICE, DISPLAY APPARATUS, AND ELECTRONIC SYSTEM

BACKGROUND

1. Technical Field

The present invention relates to light-emitting devices, display apparatuses, and electronic systems.

2. Related Art

An organic electroluminescent (EL) device is a light-emitting device including at least one organic light-emitting layer between an anode and a cathode. In this type of light-emitting device, an electric field is applied between the anode and the cathode to inject electrons from the cathode into the light-emitting layer and holes from the anode into the light-emitting layer. The electrons and the holes then recombine together in the light-emitting layer to generate excitons. When the excitons return to the ground state, their energy is released in the form of light.

One such light-emitting device includes two light-emitting layers, corresponding to red (R) and blue (B), that are stacked between the anode and the cathode so that the device can emit white light (for example, see JP-A-2007-287691 (Patent Document 1)). This white light-emitting device can be used in combination with red (R) and blue (B) color filters provided in individual pixels to display a full-color image.

The light-emitting device according to Patent Document 1 further includes an intermediate layer between the light-emitting layers to limit migration of carriers (electrons and holes) between the light-emitting layers, thereby controlling the numbers of electrons and holes recombining together in the individual light-emitting layers. This improves the characteristics of the light-emitting device, including emission efficiency and emission lifetime.

The light-emitting device according to Patent Document 1, however, has insufficient emission efficiency because the intermediate layer is simply formed of a common hole-transporting or electron-transporting material.

SUMMARY

An advantage of some aspects of the invention is that it provides a light-emitting device with high emission efficiency, a reliable display apparatus including such a light-emitting device, and a reliable electronic system including such a display apparatus.

A light-emitting device according to a first aspect of the invention includes a cathode, an anode, a first light-emitting layer that is disposed between the cathode and the anode and that emits light of a first color, a second light-emitting layer that is disposed between the first light-emitting layer and the cathode and that emits light of a second color different from the first color, and an intermediate layer that is disposed between and in contact with the first light-emitting layer and the second light-emitting layer and that contains a first material and a second material different from the first material. The light-emitting device satisfies inequality (1):

$$LL_A - LL_B \geqq 0.4 [eV] \quad (1)$$

wherein $LL_A$ [eV] is the energy level of the lowest unoccupied molecular orbital of the first material, and $LL_B$ [eV] is the energy level of the lowest unoccupied molecular orbital of the second material.

According to the first aspect of the invention, a light-emitting device with high emission efficiency can be provided.

In the light-emitting device according to the first aspect of the invention, preferably, the second light-emitting layer contains a light-emitting material and a host material that supports the light-emitting material, and the light-emitting device satisfies inequality (2):

$$LL_D - LL_B \geqq 0.3 [eV] \quad (2)$$

wherein $LL_D$ [eV] is the energy level of the lowest unoccupied molecular orbital of the host material.

In this case, electrons transported from the second light-emitting layer to the first light-emitting layer through the intermediate layer are more favorably transported by the first material, so that the light-emitting device achieves particularly high emission efficiency.

In the light-emitting device according to the first aspect of the invention, preferably, the second light-emitting layer contains a light-emitting material and a host material that supports the light-emitting material, and the light-emitting device satisfies inequality (3):

$$|LL_A - LL_D| \leqq 0.2 [eV] \quad (3)$$

wherein $LL_D$ [eV] is the energy level of the lowest unoccupied molecular orbital of the host material.

In this case, the electrons transported from the second light-emitting layer to the first light-emitting layer through the intermediate layer are more favorably transported by the first material, so that electrons and holes are prevented from recombining together in the intermediate layer. In addition, the light-emitting device achieves particularly high emission efficiency.

In the light-emitting device according to the first aspect of the invention, preferably, the light of the second color has a shorter wavelength than the light of the first color.

In this case, the intermediate layer can concentrate carriers in the layer that emits the light with a shorter wavelength. As a result, the individual light-emitting layers can emit light in a balanced manner, so that the light-emitting device achieves particularly high emission efficiency.

In the light-emitting device according to the first aspect of the invention, preferably, if the content of the first material in the intermediate layer is A [wt %] and the content of the second material in the intermediate layer is B [wt %], B/(A+B) is 0.1 to 0.9.

In this case, carriers (electrons and holes) can be more favorably transported between the first and second light-emitting layers through the intermediate layer, and sufficient numbers of electrons and holes can be injected into the first and second light-emitting layers to emit light.

In the light-emitting device according to the first aspect of the invention, preferably, the first material has a higher electron mobility than the second material.

In this case, the electrons transported from the second light-emitting layer to the first light-emitting layer through the intermediate layer are more favorably transported by the first material, so that electrons and holes are prevented from recombining together in the intermediate layer. In addition, the light-emitting device achieves particularly high emission efficiency.

In the light-emitting device according to the first aspect of the invention, preferably, the intermediate layer has an average thickness of 1 to 100 nm.

In this case, electrons and holes can be more smoothly passed between the first and second light-emitting layers through the intermediate layer with a lower drive voltage, so that the light-emitting device can emit light with sufficient luminance.

In the light-emitting device according to the first aspect of the invention, preferably, the first material is an acene-based material.

In this case, electrons can be smoothly passed from the second light-emitting layer to the first light-emitting layer through the intermediate layer, so that the light-emitting device achieves particularly high emission efficiency.

In the light-emitting device according to the first aspect of the invention, preferably, the second material is an amine-based material.

In this case, holes can be smoothly passed from the first light-emitting layer to the second light-emitting layer through the intermediate layer, so that the light-emitting device achieves particularly high emission efficiency.

In the light-emitting device according to the first aspect of the invention, preferably, the first light-emitting layer is a red light-emitting layer that emits red light as the light of the first color.

In this case, the individual light-emitting layers can emit light in a more balanced manner.

In the light-emitting device according to the first aspect of the invention, preferably, the second light-emitting layer is a blue light-emitting layer that emits blue light as the light of the second color.

In this case, the individual light-emitting layers can emit light in a more balanced manner.

The light-emitting device according to the first aspect of the invention preferably further includes a third light-emitting layer that is disposed between the first light-emitting layer and the anode or between the second light-emitting layer and the cathode and that emits light of a third color different from the first and second colors.

In this case, it is relatively easy to allow the individual light-emitting layers to emit light in a balanced manner so that they provide light of a desired color.

It is preferable that a display apparatus include the light-emitting device according to the first aspect of the invention.

In this case, a reliable display apparatus can be provided.

It is preferable that an electronic system include the above display apparatus.

In this case, a reliable electronic system can be provided.

A light-emitting device according to a second aspect of the invention includes a cathode, an anode, a first light-emitting layer that is disposed between the cathode and the anode and that emits light of a first color, a second light-emitting layer that is disposed between the first light-emitting layer and the cathode and that emits light of a second color different from the first color, and an intermediate layer that is disposed between and in contact with the first light-emitting layer and the second light-emitting layer and that contains a first material and a second material having a higher hole mobility than the first material. The first light-emitting layer contains a first light-emitting material that emits the light of the first color and a first host material that supports the first light-emitting material as a guest material. The light-emitting device satisfies inequalities (4) and (5):

$$|HL_B - HL_C| < |HL_A - HL_C| \qquad (4)$$

$$|HL_A - HL_C| \geqq 0.3 [eV] \qquad (5)$$

wherein $HL_A$ [eV] is the energy level of the highest occupied molecular orbital of the first material, $HL_B$ [eV] is the energy level of the highest occupied molecular orbital of the second material, and $HL_C$ [eV] is the energy level of the highest occupied molecular orbital of the first host material.

According to the second aspect of the invention, a light-emitting device with high emission efficiency can be provided.

In the light-emitting device according to the second aspect of the invention, preferably, the second material and the first host material satisfy inequality (6):

$$|HL_B - HL_C| \leqq 0.2 [eV] \qquad (6)$$

In this case, holes move more favorably from the first host material of the first light-emitting layer to the second material of the intermediate layer, so that the light-emitting device achieves particularly high emission efficiency.

In the light-emitting device according to the second aspect of the invention, preferably, the first material has a higher electron mobility than the second material.

In this case, electrons transported from the second light-emitting layer to the first light-emitting layer through the intermediate layer are more favorably transported by the first material. In addition, the light-emitting device achieves particularly high emission efficiency.

In the light-emitting device according to the second aspect of the invention, preferably, the light of the second color has a shorter wavelength than the light of the first color.

In this case, the individual light-emitting layers can emit light in a balanced manner, so that the light-emitting device achieves particularly high emission efficiency.

The light-emitting device according to the second aspect of the invention preferably satisfies inequality (7):

$$LL_A - LL_B \geqq 0.4 [eV] \qquad (7)$$

wherein $LL_A$ [eV] is the energy level of the lowest unoccupied molecular orbital of the first material, and $LL_B$ [eV] is the energy level of the lowest unoccupied molecular orbital of the second material.

Thus, if the first and second materials have a sufficiently large difference in the energy level of the lowest unoccupied molecular orbital, the electrons transported from the second light-emitting layer to the first light-emitting layer through the intermediate layer are more easily transported by the first material.

In the light-emitting device according to the second aspect of the invention, preferably, the second light-emitting layer contains a second light-emitting material that emits the light of the second color and a second host material that supports the second light-emitting material, and the light-emitting device satisfies inequality (8):

$$|LL_A - LL_D| \leqq 0.2 [eV] \qquad (8)$$

wherein $LL_A$ [eV] is the energy level of the lowest unoccupied molecular orbital of the first material, and $LL_D$ [eV] is the energy level of the lowest unoccupied molecular orbital of the second host material.

In this case, the second host material can more favorably pass electrons to the first material.

In the light-emitting device according to the second aspect of the invention, preferably, if the content of the first material in the intermediate layer is A [wt %] and the content of the second material in the intermediate layer is B [wt %], B/(A+B) is 0.1 to 0.9.

In this case, carriers (electrons and holes) can be more favorably transported between the first and second light-emitting layers through the intermediate layer, and sufficient numbers of electrons and holes can be injected into the first and second light-emitting layers to emit light.

In the light-emitting device according to the second aspect of the invention, preferably, the first material is an acene-based material.

In this case, electrons can be smoothly passed from the second light-emitting layer to the first light-emitting layer through the intermediate layer, so that the light-emitting device achieves particularly high emission efficiency.

In the light-emitting device according to the second aspect of the invention, preferably, the second material is an amine-based material.

In this case, holes can be smoothly passed from the first light-emitting layer to the second light-emitting layer through the intermediate layer, so that the light-emitting device achieves particularly high emission efficiency.

In the light-emitting device according to the second aspect of the invention, preferably, the intermediate layer has an average thickness of 1 to 100 nm.

In this case, electrons and holes can be more smoothly passed between the first and second light-emitting layers through the intermediate layer with a lower drive voltage, so that the light-emitting device can emit light with sufficient luminance.

In the light-emitting device according to the second aspect of the invention, preferably, the first light-emitting layer is a red light-emitting layer that emits red light as the light of the first color.

In this case, the individual light-emitting layers can emit light in a more balanced manner.

In the light-emitting device according to the second aspect of the invention, preferably, the second light-emitting layer is a blue light-emitting layer that emits blue light as the light of the second color.

In this case, the individual light-emitting layers can emit light in a more balanced manner.

The light-emitting device according to the second aspect of the invention preferably further includes a third light-emitting layer that is disposed between the first light-emitting layer and the anode or between the second light-emitting layer and the cathode and that emits light of a third color different from the first and second colors.

In this case, it is relatively easy to allow the individual light-emitting layers to emit light in a balanced manner so that they provide light of a desired color.

It is preferable that a display apparatus include the light-emitting device according to the second aspect of the invention.

In this case, a reliable display apparatus can be provided.

It is preferable that an electronic system include the above display apparatus.

In this case, a reliable electronic system can be provided.

BRIEF DESCRIPTION OF THE DRAWINGS

The invention will be described with reference to the accompanying drawings, wherein like numbers reference like elements.

FIG. 6 is a perspective view showing a digital still camera serving as an electronic system according to an embodiment of the invention.

DESCRIPTION OF EXEMPLARY EMBODIMENTS

Light-emitting devices, display apparatuses, and electronic systems according to preferred embodiments of the invention will now be described with reference to the attached drawings.

First Embodiment

Figure 1:
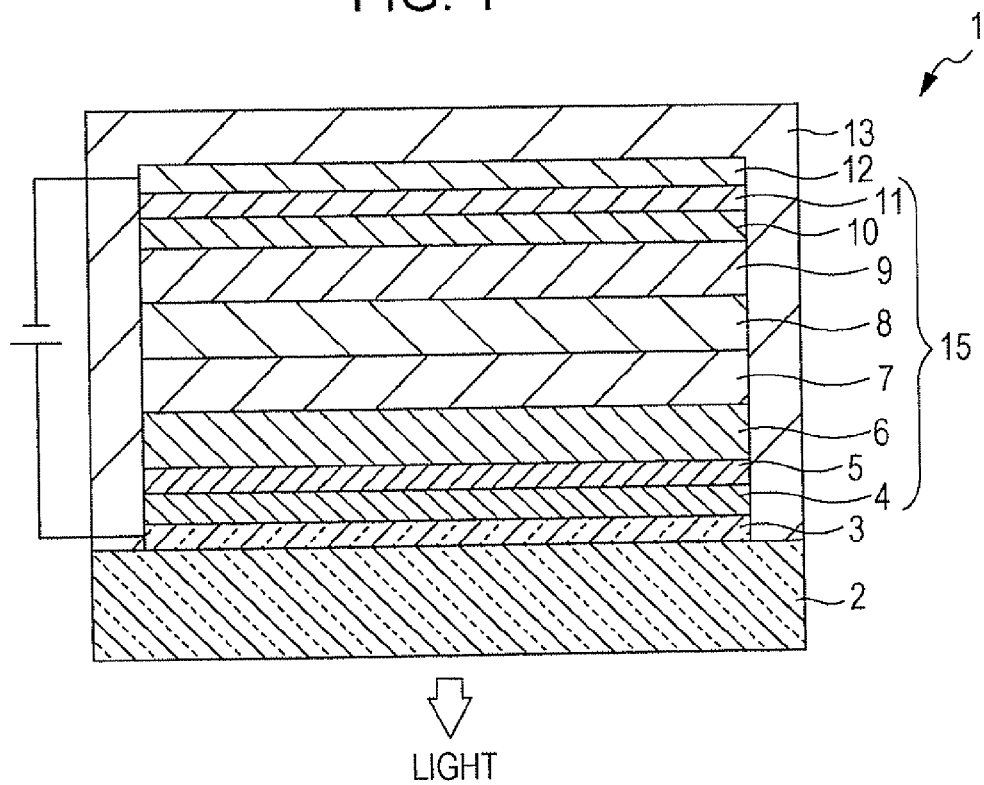
FIG. 1 is a schematic diagram showing the longitudinal section of a light-emitting device according to a first embodiment of the invention.

FIG. 1 is a schematic diagram showing the longitudinal section of a light-emitting device according to a first embodiment of the invention. For illustration purposes, the top of FIG. 1 is referred to as "top", whereas the bottom of FIG. 1 is referred to as "bottom".

A light-emitting device (EL device) 1 shown in FIG. 1 emits red (R) light, green (G) light, and blue (B) light to provide white light.

The light-emitting device 1 is formed by stacking an anode 3, a hole-injecting layer 4, a hole-transporting layer 5, a red light-emitting layer (first light-emitting layer) 6, an intermediate layer 7, a blue light-emitting layer (second light-emitting layer) 8, a green light-emitting layer (third light-emitting layer) 9, an electron-transporting layer 10, an electron-injecting layer 11, and a cathode 12 in the above order.

In other words, the light-emitting device 1 includes a laminate 15 formed between the two electrodes (the anode 3 and the cathode 12) by stacking the hole-injecting layer 4, the hole-transporting layer 5, the red light-emitting layer 6, the intermediate layer 7, the blue light-emitting layer 8, the green light-emitting layer 9, the electron-transporting layer 10, and the electron-injecting layer 11 in the above order.

The entire light-emitting device 1 is disposed on a substrate 2 and is sealed with a sealing member 13.

In the light-emitting device 1, electrons are supplied (injected) from the cathode 12 into the individual light-emitting layers 6, 8, and 9, whereas holes are supplied (injected) from the anode 3 into the individual light-emitting layers 6, 8, and 9. The electrons and the holes then recombine together in the individual light-emitting layers 6, 8, and 9 to generate excitons with energy released through the recombination. When the excitons return to the ground state, their energy (fluorescence or phosphorescence) is released (emitted). The light-emitting device 1 thus emits white light.

The substrate 2 supports the anode 3. The light-emitting device 1 according to this embodiment is configured so that light exits from the substrate 2 (bottom-emission structure), and hence the substrate 2 and the anode 3 are substantially transparent (colorless transparent, colored transparent, or translucent).

Examples of the material of the substrate 2 include resin materials such as polyethylene terephthalate, polyethylene naphthalate, polypropylene, cycloolefin polymer, polyamide, polyethersulfone, poly(methyl methacrylate), polycarbonate, and polyarylate; and glass materials such as quartz glass and soda glass. These materials can be used alone or in a combination of two or more.

The average thickness of the substrate 2 is preferably, but not limited to, about 0.1 to 30 mm, more preferably about 0.1 to 10 mm.

If the light-emitting device 1 is configured so that light exits from the side opposite the substrate 2 (top-emission structure), the substrate 2 used can be either a transparent substrate or a nontransparent substrate.

Examples of nontransparent substrates include substrates formed of ceramic materials such as alumina; metal substrates, such as stainless steel substrates, coated with oxide films (insulating films); and substrates formed of resin materials.

The components of the light-emitting device 1 will now be sequentially described.

Anode

The anode 3 is an electrode that injects holes into the hole-transporting layer 5 through the hole-injecting layer 4, described below. The anode 3 is preferably formed of a material with a high work function and good conductivity.

Examples of the material of the anode 3 include oxides such as indium tin oxide (ITO), indium zinc oxide (IZO), $In_2O_3$, $SnO_2$, Sb-doped $SnO_2$, and Al-doped ZnO; and metals such as gold, platinum, silver, copper, and alloys thereof. These materials can be used alone or in a combination of two or more.

The average thickness of the anode 3 is preferably, but not limited to, about 10 to 200 nm, more preferably about 50 to 150 nm.

Cathode

The cathode 12 is an electrode that injects electrons into the electron-transporting layer 10 through the electron-injecting layer 11, described below. The cathode 12 is preferably formed of a material with a low work function.

Examples of the material of the cathode 12 include lithium, magnesium, calcium, strontium, lanthanum, cerium, erbium, europium, scandium, yttrium, ytterbium, silver, copper, aluminum, cesium, rubidium, and alloys thereof. These materials can be used alone or in a combination of two or more (for example, in the form of a laminate of layers).

In particular, if an alloy is used as the material of the cathode 12, the alloy used is preferably an alloy containing a stable metal element such as silver, aluminum, or copper, for example, magnesium-silver alloy, aluminum-lithium alloy, or copper-lithium alloy. The use of such an alloy as the material of the cathode 12 improves the electron-injection efficiency and stability of the cathode 12.

The average thickness of the cathode 12 is preferably, but not limited to, about 100 to 10,000 nm, more preferably about 200 to 500 nm.

The cathode 12 does not have to be transparent because the light-emitting device 1 according to this embodiment has a bottom-emission structure.

Hole-Injecting Layer

The hole-injecting layer 4 functions to improve the efficiency of hole injection from the anode 3.

Examples of the material (hole-injecting material) of the hole-injecting layer 4 include, but not limited to, copper phthalocyanine and 4,4',4''-tris(N,N-phenyl-3-methylphenylamino)triphenylamine (m-MTDATA).

The average thickness of the hole-injecting layer 4 is preferably, but not limited to, about 5 to 150 nm, more preferably about 10 to 100 nm.

The hole-injecting layer 4 can be omitted.

Hole-Transporting Layer

The hole-transporting layer 5 functions to transport holes injected from the anode 3 through the hole-injecting layer 4 to the red light-emitting layer 6.

As the material of the hole-transporting layer 5, various p-type polymer materials and various p-type low-molecular-weight materials can be used alone or in combination.

The average thickness of the hole-transporting layer 5 is preferably, but not limited to, about 10 to 150 nm, more preferably about 10 to 100 nm.

The hole-transporting layer 5 can be omitted.

Red Light-Emitting Layer

The red light-emitting layer (first light-emitting layer) 6 contains a red light-emitting material (first light-emitting material) that emits light of red color (first color) and a host material (first host material) that supports the light-emitting material.

Thus, if the light of the first color has a relatively long wavelength, a light-emitting material with a relatively small difference in energy level (bandgap) between the highest occupied molecular orbital (HOMO) and the lowest unoccupied molecular orbital (LUMO) can be used. Such a light-emitting material with a relatively narrow bandgap easily traps electrons and holes to emit light. Hence, if the red light-emitting layer 6 is disposed on the anode 3 side, with the blue light-emitting layer 8 and the green light-emitting layer 9, which have wider bandgaps and therefore less easily emit light, disposed on the cathode 12 side, the individual light-emitting layers 6, 8, and 9 can emit light in a balanced manner.

In addition, if the first light-emitting material has a relatively narrow bandgap, the red light-emitting layer 6 can reliably emit light even if electrons and holes are present at low densities in the red light-emitting layer 6.

The red light-emitting material used is not specifically limited, and various red fluorescent materials and red phosphorescent materials can be used alone or in a combination of two or more.

The red fluorescent material used can be any material that emits red fluorescence. Examples of the red fluorescent material used include perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), and 4-(dicyanomethylene)-2-methyl-6-(p-dimethylaminostyryl)-4H-pyran (DCM). An example of a perylene derivative is a tetraaryldiindenoperylene derivative represented by chemical formula 1 below:

Chemical Formula 1

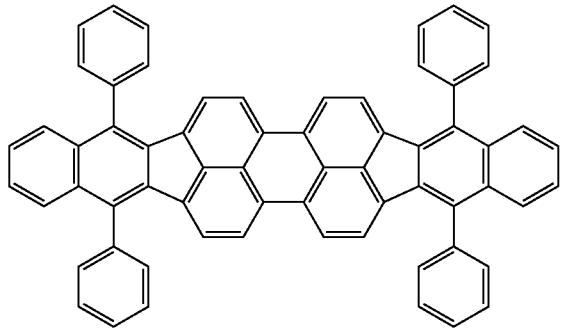

The red phosphorescent material used can be any material that emits red phosphorescence. Examples of the red phosphorescent material used include metal complexes such as iridium complexes, ruthenium complexes, platinum complexes, osmium complexes, rhenium complexes, and palladium complexes and also include those having at least one ligand with, for example, a phenylpyridine backbone, a bipyridyl backbone, or a porphyrin backbone. Specific examples include tris(1-phenylisoquinoline)iridium, bis[2-(2'-benzo[4,5-α]thienyl)pyridinato-N,C³']iridium(acetylacetonate) (btp2Ir(acac)), 2,3,7,8,12,13,17,18-octaethyl-12H,23H-porphyrin-platinum(II), bis[2-(2'-benzo[4,5-α]thienyl)pyridinato-N,C³']iridium, and bis(2-phenylpyridine)iridium(acetylacetonate).

The content (dosage) of the red light-emitting material in the red light-emitting layer 6 is preferably 0.01% to 10% by weight, more preferably 0.1% to 5% by weight. If the content of the red light-emitting material falls within such a range, the emission efficiency can be optimized, so that the red light-emitting layer 6 can emit light with a good balance of light intensity with the blue light-emitting layer 8 and the green light-emitting layer 9, described below.

In addition to the red light-emitting material described above, the first host material for supporting the red light-emitting material as a guest material is used as another constituent material of the red light-emitting layer 6. The first host material functions to excite the red light-emitting material by generating excitons through the recombination of electrons and holes and transferring the energy of the excitons to the red light-emitting material (Forster transfer or Dexter transfer). The first host material can be used by, for example, doping it with the guest material, namely, the red light-emitting material, as a dopant.

The first host material used can be any material that has the above effect on the red light-emitting material used. Examples of the first host material used if the red light-emitting material is a red fluorescent material include distyrylarylene derivatives, naphthacene derivatives, anthracene derivatives such as 2-t-butyl-9,10-di(2-naphthyl)anthracene (TBADN), perylene derivatives, distyrylbenzene derivatives, distyrylamine derivatives, quinolinolato metal complexes such as tris(8-quinolinolato)aluminum ($Alq_3$), triarylamine derivatives such as triphenylamine tetramer, oxadiazole derivatives, rubrene and derivatives thereof, silole derivatives, dicarbazole derivatives, oligothiophene derivatives, benzopyran derivatives, triazole derivatives, benzoxazole derivatives, benzothiazole derivatives, and quinoline derivatives. These materials can be used alone or in a combination of two or more.

Examples of the first host material used if the red light-emitting material is a red phosphorescent material include carbazole derivatives such as 3-phenyl-4-(1'-naphthyl)-5-phenylcarbazole and 4,4'-N,N'-dicarbazolebiphenyl (CBP). These materials can be used alone or in a combination of two or more.

Intermediate Layer

The intermediate layer 7 is disposed between and in contact with the red light-emitting layer 6 described above and the blue light-emitting layer 8, described below. The intermediate layer 7 functions to control the number of electrons transported from the blue light-emitting layer 8 to the red light-emitting layer 6 and to control the number of holes transported from the red light-emitting layer 6 to the blue light-emitting layer 8. This function allows both the red light-emitting layer 6 and the blue light-emitting layer 8 to emit light efficiently.

In this embodiment, particularly, the intermediate layer 7 contains first and second materials that satisfy inequality (1):

$$LL_A - LL_B \geq 0.4 [eV] \quad (1)$$

where $LL_A$ [eV] is the energy level of the LUMO of the first material, and $LL_B$ [eV] is the energy level of the LUMO of the second material.

Thus, if the first and second materials have a sufficiently large difference in LUMO energy level, the electrons transported from the blue light-emitting layer 8 to the red light-emitting layer 6 through the intermediate layer 7 are more easily transported by the first material. Accordingly, the number of electrons transported from the blue light-emitting layer 8 to the red light-emitting layer 6 through the intermediate layer 7 can be more easily controlled. As a result, the light-emitting device 1 achieves high emission efficiency.

The mechanism will be described in detail. When the first material receives electrons from a second host material, described below, of the blue light-emitting layer 8, the electrons passed to the first material move less easily to the second material, which has a sufficiently higher LUMO energy level, and are therefore transported via the first material. Hence, the electrons transported from the blue light-emitting layer 8 to the red light-emitting layer 6 through the intermediate layer 7 are more easily transported by the first material. This allows the number of electrons transported from the blue light-emitting layer 8 to the red light-emitting layer 6 through the intermediate layer 7 to be controlled by controlling the contents of the first and second materials. As a result, the individual light-emitting layers 6, 8, and 9 can be sufficiently supplied with the electrons required for light emission in a balanced manner and can therefore emit light in a balanced manner, so that the light-emitting device 1 achieves high emission efficiency.

Although satisfying inequality (1) above is acceptable, satisfying the inequality $LL_A - LL_B \geq 0.5 [eV]$ is preferred to enhance the above effect.

In addition, the light-emitting device 1 preferably satisfies inequality (2):

$$LL_D - LL_B \geq 0.3 [eV] \quad (2)$$

where $LL_D$ [eV] is the energy level of the LUMO of the second host material, described below. Thus, if the LUMO of the second material has a sufficiently higher energy level than that of the second host material, the electrons injected from the blue light-emitting layer 8 into the intermediate layer 7 move less easily to the second material. In other words, the second host material more favorably passes electrons to the first material. Accordingly, the electrons transported from the blue light-emitting layer 8 to the red light-emitting layer 6 through the intermediate layer 7 are more favorably transported by the first material.

In addition, the second host material and the first material preferably satisfy inequality (3):

$$|LL_A - LL_D| \leq 0.2 [eV] \quad (3)$$

Thus, if the second host material and the first material have a sufficiently small difference in LUMO energy level, the second host material more favorably passes electrons to the first material. Accordingly, the electrons transported from the blue light-emitting layer 8 to the red light-emitting layer 6 through the intermediate layer 7 are more favorably transported by the first material.

It is more preferable to satisfy the inequality $|LL_A - LL_D| \leq 0.1 [eV]$.

In addition, the first material preferably has a higher electron mobility than the second material. In this case, the electrons transported from the blue light-emitting layer 8 to the red light-emitting layer 6 through the intermediate layer 7 are more favorably transported by the first material.

In addition, it is preferable to satisfy inequality (9):

$$|HL_B - HL_C| < |HL_A - HL_C| \quad (9)$$

where $HL_A$ [eV] is the energy level of the HOMO of the first material, $HL_B$ [eV] is the energy level of the HOMO of the second material, and $HL_C$ [eV] is the energy level of the HOMO of the first host material.

Thus, if the energy level of the HOMO of the first host material is closer to that of the second material than to that of the first material, the holes injected from the red light-emitting layer 6 into the intermediate layer 7 move more favorably from the first host material of the red light-emitting layer 6 to the second material of the intermediate layer 7. This allows the number of holes transported from the red light-emitting layer 6 to the blue light-emitting layer 8 to be controlled by changing the content ratio of the second material to the first material in the intermediate layer 7. As a result, the individual light-emitting layers 6, 8, and 9 can be supplied with the number of holes required for light emission, so that the light-emitting device 1 achieves particularly high emission efficiency.

In addition, the light-emitting device 1 preferably satisfies inequality (10):

$$|HL_A - HL_C| \geq 0.3 [eV] \qquad (10)$$

Thus, if the energy level of the HOMO of the first host material is sufficiently farther away from that of the first material, the holes injected from the red light-emitting layer 6 into the intermediate layer 7 move less easily to the first material. In other words, the holes injected move more favorably from the first host material of the red light-emitting layer 6 to the second material of the intermediate layer 7.

In particular, if the light-emitting device 1 simultaneously satisfy inequalities (9) and (10) above, the number of holes transported from the red light-emitting layer 6 to the blue light-emitting layer 8 can be particularly easily controlled by changing the content ratio of the second material to the first material in the intermediate layer 7. As a result, the individual light-emitting layers 6, 8, and 9 of the light-emitting device 1 can emit light in a more balanced manner, so that the light-emitting device 1 achieves particularly high emission efficiency.

In addition, the second material and the first host material preferably satisfy inequality (11):

$$|HL_B - HL_C| \leq 0.2 [eV] \qquad (11)$$

In this case, holes move more favorably from the first host material of the red light-emitting layer 6 to the second material of the intermediate layer 7.

It is more preferable to satisfy the inequality $|HL_B - HL_C| \leq 0.1$ [eV].

In addition, the second material preferably has a higher hole mobility than the first material. In this case, holes travel through the intermediate layer 7 via the second material, so that they can be more smoothly transported from the red light-emitting layer 6 to the blue light-emitting layer 8.

The first and second materials used can be any materials that satisfy inequality (1) above, and various materials functioning to transport holes and various materials functioning to transport electrons can be used. For example, the first material used can be an acene-based material (i.e., a material having an acene backbone), whereas the second material used can be an amine-based material (i.e., a material having an amine backbone).

If such compounds are used as the first and second materials, the light-emitting device 1 can readily satisfy inequality (1) above.

An amine-based material has hole transportability, and its hole mobility is relatively high. An acene-based material, on the other hand, has electron transportability and hole transportability, and its electron mobility is relatively high. The intermediate layer 7 therefore has both electron transportability and hole transportability; in other words, the intermediate layer 7 is bipolar. Thus, if the intermediate layer 7 is bipolar, holes can be smoothly passed from the red light-emitting layer 6 to the blue light-emitting layer 8 through the intermediate layer 7, and electrons can be smoothly passed from the blue light-emitting layer 8 to the red light-emitting layer 6 through the intermediate layer 7. As a result, electrons and holes can be efficiently injected into the red light-emitting layer 6 and the blue light-emitting layer 8 to emit light.

In addition, because the intermediate layer 7 has high carrier (electron and hole) transportability, electrons and holes are less likely to recombine together in the intermediate layer 7, and accordingly excitons are less likely to be generated in the intermediate layer 7. This prevents or inhibits degradation of the intermediate layer 7 due to excitons in the intermediate layer 7, so that the light-emitting device 1 achieves high durability.

The acene-based material that can be used as the first material can be any material that has an acene backbone and that can satisfy inequality (1) above. Examples of the acene-based material used include naphthalene derivatives, anthracene derivatives, tetracene derivatives, pentacene derivatives, hexacene derivatives, and heptacene derivatives. These materials can be used alone or in a combination of two or more. In particular, anthracene derivatives are preferred.

Anthracene derivatives have high electron transportability, and their films can readily be formed by vapor deposition. Hence, if the acene-based material used is an anthracene derivative, the first material (and therefore the intermediate layer 7) achieves high electron transportability, and a uniform intermediate layer 7 can readily be formed.

Among anthracene derivatives, those having naphthyl groups at the 9- and 10-positions of the anthracene backbone are preferred as the acene-based material used for the intermediate layer 7. In this case, the above effect is enhanced. Such anthracene derivatives are exemplified by 9,10-di(2-naphthyl)anthracene (ADN), as represented by chemical formula 2 below, 2-t-butyl-9,10-di(2-naphthyl)anthracene (TBADN), as represented by chemical formula 3 below, 2-methyl-9,10-di(2-naphthyl)anthracene (MADN), as represented by chemical formula 4 below, and 2-methyl-9,10-di(1-naphthyl)anthracene (α,α-MADN), as represented by chemical formula 5 below:

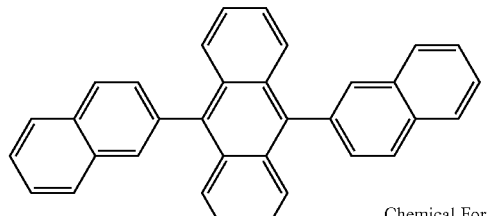

Chemical Formula 2

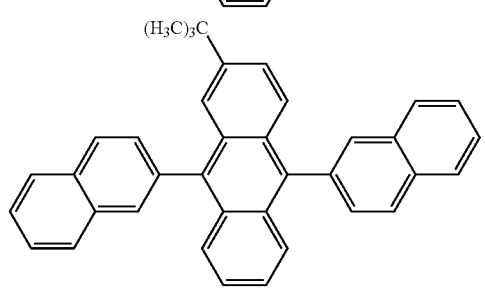

Chemical Formula 3

Chemical Formula 4

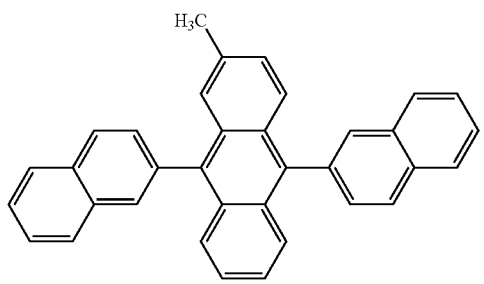

Chemical Formula 5

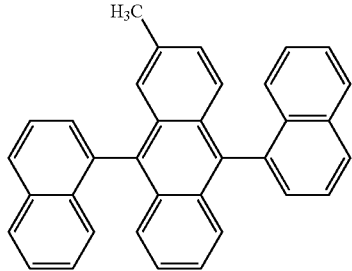

In general, such acene-based materials have high electron transportability, and their electron mobility is higher than that of amine-based materials as described below. Hence, electrons can be smoothly passed from the blue light-emitting layer 8 to the red light-emitting layer 6 through the intermediate layer 7.

The content of the acene-based material in the intermediate layer 7 is preferably, but not limited to, 10% to 90% by weight, more preferably 30% to 70% by weight, and most preferably 40% to 60% by weight.

The amine-based material that can be used as the second material can be any material that has an amine backbone and that satisfies inequality (1) above. For example, of the hole-transporting materials described above, those having an amine backbone can be used, and benzidine-based amine derivatives are preferred.

Among benzidine-based amine derivatives, those having two or more naphthyl groups are preferred as the amine-based material used for the intermediate layer 7. Such benzidine-based amine derivatives are exemplified by N,N'-bis(1-naphthyl)-N,N'-diphenyl-1,1'-biphenyl-4,4'-diamine (α-NPD), as represented by chemical formula 6 below, and N,N,N',N'-tetranaphthyl-benzidine (TNB), as represented by chemical formula 7 below:

Chemical Formula 6

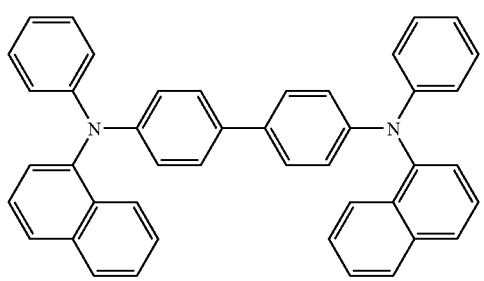

Chemical Formula 7

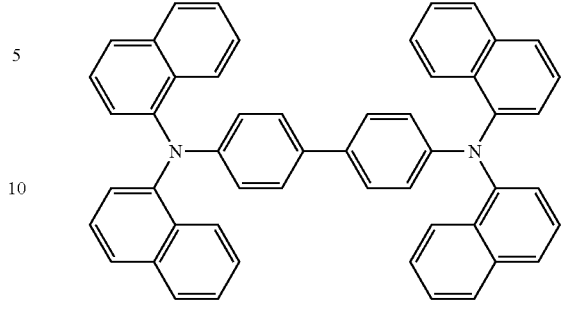

In general, such amine-based materials have high hole transportability, and their hole mobility is higher than that of acene-based materials as described above. Hence, holes can be smoothly passed from the red light-emitting layer 6 to the blue light-emitting layer 8 through the intermediate layer 7.

The content of the amine-based material in the intermediate layer 7 is preferably, but not limited to, 10% to 90% by weight, more preferably 30% to 70% by weight, and most preferably 40% to 60% by weight.

If the content of the first material in the intermediate layer 7 is A [wt %] and the content of the second material in the intermediate layer 7 is B [wt %], B/(A+B) is preferably 0.1 to 0.9, more preferably 0.3 to 0.7, and most preferably 0.4 to 0.6. In this case, carriers (electrons and holes) can be more favorably transported between the red light-emitting layer 6 and the blue light-emitting layer 8 through the intermediate layer 7, and sufficient numbers of electrons and holes can be injected into the red light-emitting layer 6 and the blue light-emitting layer 8 to emit light.

The average thickness of the intermediate layer 7 is preferably, but not limited to, 1 to 100 nm, more preferably 3 to 50 nm, and most preferably 5 to 30 nm. In this case, electrons and holes can be more smoothly passed between the red light-emitting layer 6 and the blue light-emitting layer 8 through the intermediate layer 7 with a lower drive voltage, so that the light-emitting device 1 can emit light with sufficient luminance.

Blue Light-Emitting Layer

The blue light-emitting layer (second light-emitting layer) 8 contains a blue light-emitting material (second light-emitting layer) that emits blue light (second color) and the second host material, which supports the blue light-emitting material as a guest material.

The blue light-emitting material used is not specifically limited, and various blue fluorescent materials and blue phosphorescent materials can be used alone or in a combination of two or more.

The blue fluorescent material used can be any material that emits blue fluorescence. Examples of the blue fluorescent material used include distyryl derivatives, fluoranthene derivatives, pyrene derivatives, perylene and derivatives thereof, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly [(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethynylbenzene)]. These materials can be used alone or in a combination of two or more.

The blue phosphorescent material used can be any material that emits blue phosphorescence. Examples of the blue phosphorescent material used include metal complexes such as iridium complexes, ruthenium complexes, platinum complexes, osmium complexes, rhenium complexes, and palladium complexes. Specific examples include bis[4,6-difluorophenylpyridinato-N,$C^{2'}$]-picolinate-iridium, tris[2-(2,4-difluorophenyl)pyridinato-N,$C^{2'}$]iridium, bis[2-(3,5-trifluoromethyl)pyridinato-N,$C^{2'}$]-picolinate-iridium, and bis(4,6-difluorophenylpyridinato-N,$C^{2'}$)iridium(acetylacetonate).

The second host material that can be used for the blue light-emitting layer 8 can be a host material similar to the first host material described above.

The second host material satisfies predetermined conditions with the materials used for the intermediate layer 7 described above.

Green Light-Emitting Layer

The green light-emitting layer (third light-emitting layer) 9 contains a green light-emitting material (third light-emitting material) that emits green light (third color) and a third host material that supports the green light-emitting material as a guest material.

The green light-emitting material used is not specifically limited, and various green fluorescent materials and green phosphorescent materials can be used alone or in a combination of two or more.

The green fluorescent material used can be any material that emits green fluorescence. Examples of the green fluorescent material used include coumarin derivatives, quinacridone and derivatives thereof, 9,10-bis[(9-ethyl-3-carbazolyl)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-alt-co-(2-methoxy-5-(2-ethoxylhexyloxy)-1,4-phenylene)]. These materials can be used alone or in a combination of two or more.

The green phosphorescent material used can be any material that emits green phosphorescence. Examples of the green phosphorescent material used include metal complexes such as iridium complexes, ruthenium complexes, platinum complexes, osmium complexes, rhenium complexes, and palladium complexes. Of these metal complexes, those having at least one ligand with, for example, a phenylpyridine backbone, a bipyridyl backbone, or a porphyrin backbone are preferred. Specific examples include fac-tris(2-phenylpyridine)iridium (Ir(ppy)$_3$), bis(2-phenylpyridinato-N,$C^{2'}$)iridium(acetylacetonate), and fac-tris[5-fluoro-2-(5-trifluoromethyl-2-pyridinyl)phenyl-C,N]iridium.

The third host material that can be used for the green light-emitting layer 9 can be a host material similar to the first host material described above.

Electron-Transporting Layer

The electron-transporting layer 10 functions to transport electrons injected from the cathode 12 through the electron-injecting layer 11 to the green light-emitting layer 9.

Examples of the material (electron-transporting material) of the electron-transporting layer 10 include quinoline derivatives (such as organometallic complexes having 8-quinolinol or its derivative as a ligand, for example, tris(8-quinolinolato) aluminum (Alq$_3$)), oxadiazole derivatives, perylene derivatives, pyridine derivatives, pyrimidine derivatives, quinoxaline derivatives, diphenylquinone derivatives, and nitro-substituted fluorene derivatives. These materials can be used alone or in a combination of two or more.

The average thickness of the electron-transporting layer 10 is preferably, but not limited to, about 0.5 to 100 nm, more preferably about 1 to 50 nm.

Electron-Injecting Layer

The electron-injecting layer 11 functions to improve the efficiency of electron injection from the cathode 12.

Examples of the material (electron-injecting material) of the electron-injecting layer 11 include various inorganic insulating materials and various inorganic semiconductor materials.

Examples of inorganic insulating materials include alkali metal chalcogenides (oxides, sulfides, selenides, and tellurides), alkaline earth metal chalcogenides, alkali metal halides, and alkaline earth metal halides. These materials can be used alone or in a combination of two or more. These materials can be used as the main material of the electron-injecting layer 11 to improve its electron injectability. In particular, the light-emitting device 1 achieves high luminance if the electron-injecting layer 11 is formed of an alkali metal compound (such as an alkali metal chalcogenide or an alkali metal halide) because it has a very low work function.

Examples of alkali metal chalcogenides include $Li_2O$, $LiO$, $Na_2S$, $Na_2Se$, and $NaO$.

Examples of alkaline earth metal chalcogenides include $CaO$, $BaO$, $SrO$, $BeO$, $BaS$, $MgO$, and $CaSe$.

Examples of alkali metal halides include $CsF$, $LiF$, $NaF$, $KF$, $LiCl$, $KCl$, and $NaCl$.

Examples of alkaline earth metal halides include $CaF_2$, $BaF_2$, $SrF_2$, $MgF_2$, and $BeF_2$.

Examples of inorganic semiconductor materials include oxides, nitrides, and oxynitrides containing at least one element selected from the group consisting of lithium, sodium, barium, calcium, strontium, ytterbium, aluminum, gallium, indium, cadmium, magnesium, silicon, tantalum, antimony, and zinc. These materials can be used alone or in a combination of two or more.

The average thickness of the electron-injecting layer 11 is preferably, but not limited to, about 0.1 to 1,000 nm, more preferably about 0.2 to 100 nm, and most preferably about 0.2 to 50 nm.

Sealing Member

The sealing member 13 is disposed so as to cover and hermetically seal the anode 3, the laminate 15, and the cathode 12, thus functioning to block oxygen and water. Disposing the sealing member 13 provides benefits such as improving the reliability of the light-emitting device 1 and preventing deterioration (improving durability).

Examples of the material of the sealing member 13 include aluminum, gold, chromium, niobium, tantalum, titanium, alloys thereof, silicon oxide, and various resin materials. If the sealing member 13 is formed of a conductive material, an insulating film is preferably provided as needed between the sealing member 13 and the anode 3, the laminate 15, and the cathode 12 to prevent a short circuit.

Alternatively, the sealing member 13 may be formed in a flat shape and disposed opposite the substrate 2 with the gap therebetween sealed with a sealant such as a thermosetting resin.

In the light-emitting device 1 thus configured, the intermediate layer 7, containing the first and second materials, can transport electrons and holes between the red light-emitting layer 6 and the blue light-emitting layer 8 in a balanced manner, so that the red light-emitting layer 6 and the blue light-emitting layer 8 can each efficiently emit light. As a result, the light-emitting device 1 achieves high emission efficiency.

In this embodiment, particularly, the light of the second color has a shorter wavelength than the light of the first color. In such a case, a common light-emitting device has a problem in that it is difficult to achieve a good emission balance between individual light-emitting layers because light with a shorter wavelength is less easily emitted. In this embodiment, however, the intermediate layer 7 described above can concentrate electrons in the layer that emits light with a shorter wavelength (in this embodiment, the blue light-emitting layer 8). As a result, the individual light-emitting layers 6, 8, and 9 can emit light in a balanced manner, so that the light-emitting device 1 achieves high emission efficiency.

In this embodiment, additionally, the red light-emitting layer 6, the intermediate layer 7, the blue light-emitting layer 8, and the green light-emitting layer 9 are arranged in the above order from the anode 3 to the cathode 12. With this arrangement, it is relatively easy to allow the light-emitting device 1 to emit red (R) light, green (G) light, and blue (B) light in a balanced manner so that they emit white light.

Second Embodiment

Figure 2:
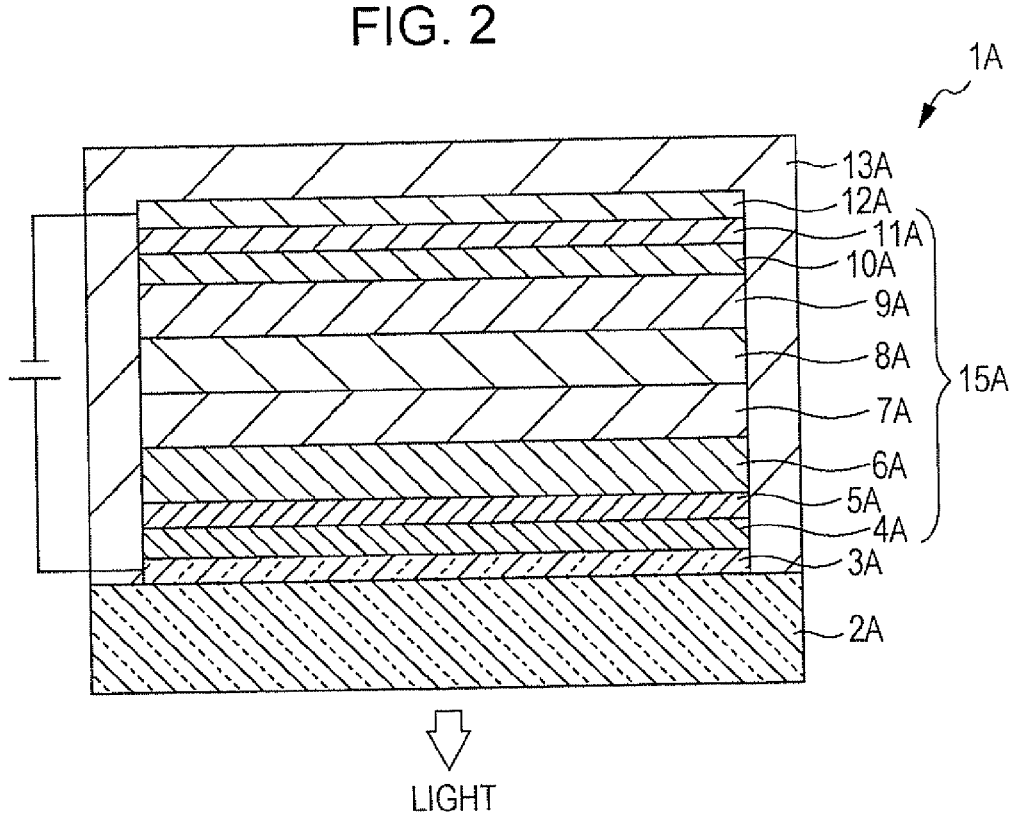
FIG. 2 is a schematic diagram showing the longitudinal section of a light-emitting device according to a second embodiment of the invention.

FIG. 2 is a schematic diagram showing the longitudinal section of a light-emitting device according to a second embodiment of the invention. For illustration purposes, the top of FIG. 2 is referred to as "top", whereas the bottom of FIG. 2 is referred to as "bottom".

A light-emitting device (EL device) 1A shown in FIG. 2 emits red (R) light, green (G) light, and blue (B) light to provide white light.

The light-emitting device 1A is formed by stacking an anode 3A, a hole-injecting layer 4A, a hole-transporting layer 5A, a red light-emitting layer (first light-emitting layer) 6A, an intermediate layer 7A, a blue light-emitting layer (second light-emitting layer) BA, a green light-emitting layer (third light-emitting layer) 9A, an electron-transporting layer 10A, an electron-injecting layer 11A, and a cathode 12A in the above order.

In other words, the light-emitting device 1A includes a laminate 15A formed between the two electrodes (the anode 3A and the cathode 12A) by stacking the hole-injecting layer 4A, the hole-transporting layer 5A, the red light-emitting layer 6A, the intermediate layer 7A, the blue light-emitting layer 8A, the green light-emitting layer 9A, the electron-transporting layer 10A, and the electron-injecting layer 11A in the above order.

The entire light-emitting device 1A is disposed on a substrate 2A and is sealed with a sealing member 13A.

In the light-emitting device 1A, electrons are supplied (injected) from the cathode 12A into the individual light-emitting layers 6A, 8A, and 9A, whereas holes are supplied (injected) from the anode 3A into the individual light-emitting layers 6A, 8A, and 9A. The electrons and the holes then recombine together in the individual light-emitting layers 6A, 8A, and 9A to generate excitons with energy released through the recombination. When the excitons return to the ground state, their energy (fluorescence or phosphorescence) is released (emitted). The light-emitting device 1A thus emits white light.

The substrate 2A supports the anode 3A. The light-emitting device 1A according to this embodiment is configured so that light exits from the substrate 2A (bottom-emission structure), and hence the substrate 2A and the anode 3A are substantially transparent (colorless transparent, colored transparent, or translucent).

Examples of the material of the substrate 2A include resin materials such as polyethylene terephthalate, polyethylene naphthalate, polypropylene, cycloolefin polymer, polyamide, polyethersulfone, poly(methyl methacrylate), polycarbonate, and polyarylate; and glass materials such as quartz glass and soda glass. These materials can be used alone or in a combination of two or more.

The average thickness of the substrate 2A is preferably, but not limited to, about 0.1 to 30 mm, more preferably about 0.1 to 10 mm.

If the light-emitting device 1A is configured so that light exits from the side opposite the substrate 2A (top-emission structure), the substrate 2A used can be either a transparent substrate or a nontransparent substrate.

Examples of nontransparent substrates include substrates formed of ceramic materials such as alumina; metal substrates, such as stainless steel substrates, coated with oxide films (insulating films); and substrates formed of resin materials.

The components of the light-emitting device 1A will now be sequentially described.

Anode

The anode 3A is an electrode that injects holes into the hole-transporting layer 5A through the hole-injecting layer 4A, described below. The anode 3A is preferably formed of a material with a high work function and good conductivity.

Examples of the material of the anode 3A include oxides such as ITO, IZO, $In_3O_3$, $SnO_2$, Sb-doped $SnO_2$, and Al-doped ZnO; and metals such as gold, platinum, silver, copper, and alloys thereof. These materials can be used alone or in a combination of two or more.

The average thickness of the anode 3A is preferably, but not limited to, about 10 to 200 nm, more preferably about 50 to 150 nm.

Cathode

The cathode 12A is an electrode that injects electrons into the electron-transporting layer 10A through the electron-injecting layer 11A, described below. The cathode 12A is preferably formed of a material with a low work function.

Examples of the material of the cathode 12A include lithium, magnesium, calcium, strontium, lanthanum, cerium, erbium, europium, scandium, yttrium, ytterbium, silver, copper, aluminum, cesium, rubidium, and alloys thereof. These materials can be used alone or in a combination of two or more (for example, in the form of a laminate of layers).

In particular, if an alloy is used as the material of the cathode 12A, the alloy used is preferably an alloy containing a stable metal element such as silver, aluminum, or copper, for example, magnesium-silver alloy, aluminum-lithium alloy, or copper-lithium alloy. The use of such an alloy as the material of the cathode 12A improves the electron-injection efficiency and stability of the cathode 12A.

The average thickness of the cathode 12A is preferably, but not limited to, about 100 to 10,000 nm, more preferably about 200 to 500 nm.

The cathode 12A does not have to be transparent because the light-emitting device 1A according to this embodiment has a bottom-emission structure.

Hole-Injecting Layer

The hole-injecting layer 4A functions to improve the efficiency of hole injection from the anode 3A.

Examples of the material (hole-injecting material) of the hole-injecting layer 4A include, but not limited to, copper phthalocyanine and 4,4',4''-tris(N,N-phenyl-3-methylphenylamino)triphenylamine (m-MTDATA).

The average thickness of the hole-injecting layer 4A is preferably, but not limited to, about 5 to 150 nm, more preferably about 10 to 100 nm.

The hole-injecting layer 4A can be omitted.

Hole-Transporting Layer

The hole-transporting layer 5A functions to transport holes injected from the anode 3A through the hole-injecting layer 4A to the red light-emitting layer 6A.

As the material of the hole-transporting layer 5A, various p-type polymer materials and various p-type low-molecular-weight materials can be used alone or in combination.

The average thickness of the hole-transporting layer 5A is preferably, but not limited to, about 10 to 150 nm, more preferably about 10 to 100 nm.

The hole-transporting layer 5A can be omitted.

Red Light-Emitting Layer

The red light-emitting layer (first light-emitting layer) 6A contains a red light-emitting material (first light-emitting material) that emits red light (first color) and a host material (first host material) that supports the light-emitting material.

Thus, if the light of the first color has a relatively long wavelength, a light-emitting material with a relatively small difference in energy level (bandgap) between the HOMO and the LUMO can be used. Such a light-emitting material with a relatively narrow bandgap easily traps electrons and holes to emit light. Hence, if the red light-emitting layer 6A is disposed on the anode 3A side, with the blue light-emitting layer 8A and the green light-emitting layer 9A, which have wider bandgaps and therefore less easily emit light, disposed on the cathode 12A side, the individual light-emitting layers 6A, 8A, and 9A can emit light in a balanced manner.

In addition, if the first light-emitting material has a relatively narrow bandgap, the red light-emitting layer 6A can reliably emit light even if electrons and holes are present at low densities in the red light-emitting layer 6A.

The red light-emitting material used is not specifically limited, and various red fluorescent materials and red phosphorescent materials can be used alone or in a combination of two or more.

The red fluorescent material used can be any material that emits red fluorescence. Examples of the red fluorescent material used include perylene derivatives, europium complexes, benzopyran derivatives, rhodamine derivatives, benzothioxanthene derivatives, porphyrin derivatives, Nile red, 2-(1,1-dimethylethyl)-6-(2-(2,3,6,7-tetrahydro-1,1,7,7-tetramethyl-1H,5H-benzo(ij)quinolizin-9-yl)ethenyl)-4H-pyran-4H-ylidene)propanedinitrile (DCJTB), and 4-(dicyanomethylene)-2-methyl-6-(p-dimethylaminostyryl)-4H-pyran (DCM). An example of a perylene derivative is a tetraaryldiindenoperylene derivative as represented by chemical formula 8 below:

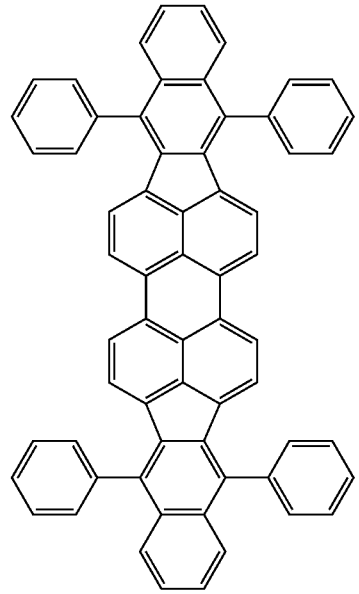

Chemical Formula 8

The red phosphorescent material used can be any material that emits red phosphorescence. Examples of the red phosphorescent material used include metal complexes such as iridium complexes, ruthenium complexes, platinum complexes, osmium complexes, rhenium complexes, and palladium complexes and also include those having at least one ligand with, for example, a phenylpyridine backbone, a bipyridyl backbone, or a porphyrin backbone. Specific examples include tris(1-phenylisoquinoline)iridium, bis[2-(2'-benzo[4,5-α]thienyl)pyridinato-N,$C^{3'}$]iridium(acetylacetonate) (btp2Ir(acac)), 2,3,7,8,12,13,17,18-octaethyl-12H,23H-porphyrin-platinum(II), bis[2-(2'-benzo[4,5-α]thienyl)pyridinato-N,$C^{3'}$]iridium, and bis(2-phenylpyridine)iridium(acetylacetonate).

The content (dosage) of the red light-emitting material in the red light-emitting layer 6A is preferably 0.01% to 10% by weight, more preferably 0.1% to 5% by weight. If the content of the red light-emitting material falls within such a range, the emission efficiency can be optimized, so that the red light-emitting layer 6A can emit light with a good balance of light intensity with the blue light-emitting layer 8A and the green light-emitting layer 9A, described below.

In addition to the red light-emitting material described above, the first host material for supporting the red light-emitting material as a guest material is used as another constituent material of the red light-emitting layer 6A. The first host material functions to excite the red light-emitting material by generating excitons through the recombination of electrons and holes and transferring the energy of the excitons to the red light-emitting material (Forster transfer or Dexter transfer). The first host material can be used by, for example, doping it with the guest material, namely, the red light-emitting material, as a dopant.

The first host material satisfies predetermined conditions with the materials used for the intermediate layer 7A, described below The first host material used can be any material that has the above effect on the red light-emitting material used. Examples of the first host material used if the red light-emitting material is a red fluorescent material include distyrylarylene derivatives, naphthacene derivatives, anthracene derivatives such as 2-t-butyl-9,10-di(2-naphthyl)anthracene (TBADN), perylene derivatives, distyrylbenzene derivatives, distyrylamine derivatives, quinolinolato metal complexes such as tris(8-quinolinolato)aluminum ($Alq_3$), triarylamine derivatives such as triphenylamine tetramer, oxadiazole derivatives, rubrene and derivatives thereof, silole derivatives, dicarbazole derivatives, oligothiophene derivatives, benzopyran derivatives, triazole derivatives, benzoxazole derivatives, benzothiazole derivatives, guinoline derivatives, and 4,4'-bis(2,2'-diphenylvinyl)biphenyl (DPVBi). These materials can be used alone or in a combination of two or more.

Examples of the first host material used if the red light-emitting material is a red phosphorescent material include carbazole derivatives such as 3-phenyl-4-(1'-naphthyl)-5-phenylcarbazole and 4,4'-N,N'-dicarbazolebiphenyl (CBP). These materials can be used alone or in a combination of two or more.

Intermediate Layer

The intermediate layer 7A is disposed between and in contact with the red light-emitting layer 6A described above and the blue light-emitting layer 8A, described below. The intermediate layer 7A functions to control the number of electrons transported from the blue light-emitting layer 8A to the red light-emitting layer 6A and to control the number of holes transported from the red light-emitting layer 6A to the blue light-emitting layer 8A. This function allows both the red light-emitting layer 6A and the blue light-emitting layer 8A to emit light efficiently.

In this embodiment, particularly, the intermediate layer 7A contains a first material and a second material with a higher hole mobility than the first material. In addition, inequalities (4) and (5) are satisfied:

$$|HL_B - HL_C| < |HL_A - HL_C| \tag{4}$$

$$|HL_A - HL_C| \geqq 0.3 [eV] \tag{5}$$

where $HL_A$ [eV] is the energy level of the HOMO of the first material, $HL_B$ [eV] is the energy level of the HOMO of the second material, and $HL_C$ [eV] is the energy level of the HOMO of the first host material.

If inequalities (4) and (5) above are satisfied, the number of holes transported from the red light-emitting layer 6A to the blue light-emitting layer 8A can be controlled. As a result, the light-emitting device 1A achieves high emission efficiency.

The mechanism will be described in detail. The energy level of the HOMO of the first host material is closer to that of the second material than to that of the first material and is sufficiently farther away from that of the first material. As a result, holes move more favorably from the first host material of the red light-emitting layer 6A to the second material of the intermediate layer 7A. In addition, holes move less easily from the first host material to the first material. This allows the number of holes transported from the red light-emitting layer 6A to the blue light-emitting layer 8A to be controlled by changing the content ratio of the second material to the first material in the intermediate layer 7A.

In addition, the second material has a higher hole mobility than the first material. This allows the holes moved to the second material to be efficiently transported to the blue light-emitting layer 8A.

Thus, because the light-emitting device 1A includes the intermediate layer 7A described above, the density of holes in the individual light-emitting layers 6A, 8A, and 9A can be controlled so that they can emit light in a balanced manner. As a result, the light-emitting device 1A achieves high emission efficiency.

In addition, the second material and the first host material preferably satisfy inequality (6):

$$|HL_B - HL_C| \leqq 0.2 [eV] \tag{6}$$

Thus, if the second material and the first host material have a sufficiently small difference in HOMO energy level, holes move more favorably from the first host material of the red light-emitting layer 6A to the second material of the intermediate layer 7A.

It is more preferable to satisfy the inequality $|HL_B - HL_C| \leqq 0.1$ [eV].

In addition, the first and second materials preferably satisfy inequality (7):

$$LL_A - LL_B \geqq 0.4 [eV] \tag{7}$$

where $LL_A$ [eV] is the energy level of the LUMO of the first material, and $LL_B$ [eV] is the energy level of the LUMO of the second material.

It is more preferable to satisfy the inequality $LL_A - LL_B \geqq 0.5$ [eV].

Thus, if the first and second materials have a sufficiently large difference in LUMO energy level, the electrons transported from the blue light-emitting layer 8A to the red light-emitting layer 6A through the intermediate layer 7A are more easily transported by the first material, so that the light-emitting device 1A achieves particularly high emission efficiency.

The mechanism will be described in detail. When the first material receives electrons from a second host material, described below, of the blue light-emitting layer BA, the electrons passed to the first material move less easily to the second material, which has a sufficiently higher LUMO energy level, and are therefore transported via the first material. Hence, the electrons transported from the blue light-emitting layer 8A to the red light-emitting layer 6A through the intermediate layer 7A are more easily transported by the first material. This allows the number of electrons transported from the blue light-emitting layer 8A to the red light-emitting layer 6A through the intermediate layer 7A to be controlled by controlling the contents of the first and second materials. As a result, the individual light-emitting layers 6A, 8A, and 9A can emit light in a balanced manner, so that the light-emitting device 1A achieves particularly high emission efficiency.

In addition, the second host material, described below, and the first material preferably satisfy inequality (8):

$$|LL_A - LL_D| \leqq 0.2 [eV] \tag{8}$$

where $LL_D$ [eV] is the energy level of the LUMO of the second host material. Thus, if the second host material and the first material have a sufficiently small difference in LUMO energy level, the second host material more favorably passes electrons to the first material. Accordingly, the electrons transported from the blue light-emitting layer 8A to the red light-emitting layer 6A through the intermediate layer 7A are more favorably transported by the first material.

It is more preferable to satisfy the inequality $|LL_A - LL_D| \leqq 0.1$ [eV].

In addition, the light-emitting device 1A preferably satisfies inequality (12):

$$LL_D - LL_B \geqq 0.3 [eV] \tag{12}$$

Thus, if the LUMO of the second material has a sufficiently higher energy level than that of the second host material, the electrons injected from the blue light-emitting layer 8A into the intermediate layer 7A move less easily to the second material. In other words, the second host material more favorably passes electrons to the first material. Accordingly, the electrons transported from the blue light-emitting layer 8A to the red light-emitting layer 6A through the intermediate layer 7A are more favorably transported by the first material.

As for inequality (12), it is more preferable to satisfy the inequality $LL_D - LL_B \geqq 0.5$ [eV] to enhance the above effect.

In addition, the first material preferably has a higher electron mobility than the second material. In this case, the electrons transported from the blue light-emitting layer 8A to the red light-emitting layer 6A through the intermediate layer 7A are more favorably transported by the first material.

The first and second materials used can be any materials that satisfy inequalities (4) and (5) above, and various materials functioning to transport holes and various materials functioning to transport electrons can be used. For example, the first material used can be an acene-based material (i.e., a material having an acene backbone), whereas the second material used can be an amine-based material (i.e., a material having an amine backbone).

If such compounds are used as the first and second materials, the light-emitting device 1A can readily satisfy inequalities (4) and (5) above.

An amine-based material has hole transportability, and its hole mobility is relatively high. An acene-based material, on the other hand, has electron transportability and hole transportability, and its electron mobility is relatively high. The intermediate layer 7A therefore has both electron transportability and hole transportability; in other words, the intermediate layer 7A is bipolar. Thus, if the intermediate layer 7A is bipolar, holes can be smoothly passed from the red light-emitting layer 6A to the blue light-emitting layer 8A through the intermediate layer 7A, and electrons can be smoothly passed from the blue light-emitting layer 8A to the red light-emitting layer 6A through the intermediate layer 7A. As a result, electrons and holes can be efficiently injected into the red light-emitting layer 6A and the blue light-emitting layer 8A to emit light.

In addition, because the intermediate layer 7A has high carrier (electron and hole) transportability, electrons and holes are less likely to recombine together in the intermediate layer 7A, and accordingly excitons are less likely to be generated in the intermediate layer 7A. This prevents or inhibits degradation of the intermediate layer 7A due to excitons in the intermediate layer 7A, so that the light-emitting device 1A achieves high durability.

The acene-based material that can be used as the first material can be any material that has an acene backbone and that can satisfy inequalities (4) and (5) above. Examples of the acene-based material used include naphthalene derivatives, anthracene derivatives, tetracene derivatives, pentacene derivatives, hexacene derivatives, and heptacene derivatives. These materials can be used alone or in a combination of two or more. In particular, anthracene derivatives are preferred.

Anthracene derivatives have high electron transportability, and their films can readily be formed by vapor deposition. Hence, if the acene-based material used is an anthracene derivative, the first material (and therefore the intermediate layer 7A) achieves high electron transportability, and a uniform intermediate layer 7A can readily be formed.

Among anthracene derivatives, those having naphthyl groups at the 9- and 10-positions of the anthracene backbone are preferred as the acene-based material used for the intermediate layer 7A. In this case, the above effect is enhanced. Such anthracene derivatives are exemplified by 9,10-di(2-naphthyl)anthracene (ADN), as represented by chemical formula 9 below, 2-t-butyl-9,10-di(2-naphthyl)anthracene (TBADN), as represented by chemical formula 10 below, 2-methyl-9,10-di(2-naphthyl)anthracene (MADN), as represented by chemical formula 11 below, and 2-methyl-9,10-di(1-naphthyl)anthracene ($\alpha,\alpha$-MADN), as represented by chemical formula 12 below:

Chemical Formula 9

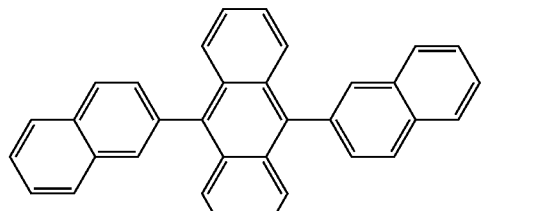

Chemical Formula 10

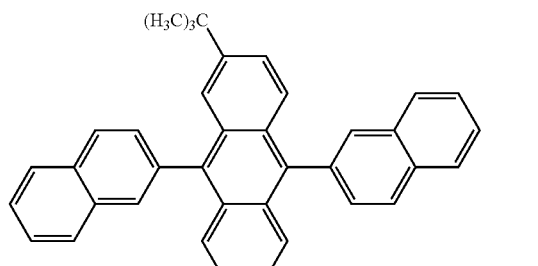

Chemical Formula 11

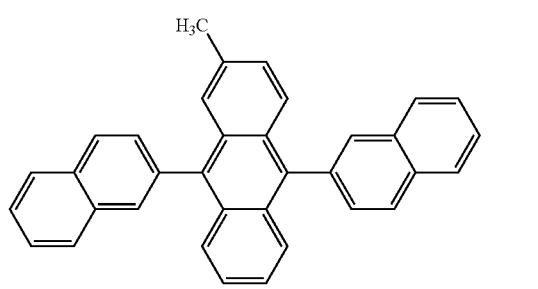

Chemical Formula 12

In general, such acene-based materials have high electron transportability, and their electron mobility is higher than that of amine-based materials as described below. Hence, electrons can be smoothly passed from the blue light-emitting layer 8A to the red light-emitting layer 6A through the intermediate layer 7A.

The content of the acene-based material in the intermediate layer 7A is preferably, but not limited to, 10% to 90% by weight, more preferably 30% to 70% by weight, and most preferably 40% to 60% by weight.

The amine-based material that can be used as the second material can be any material that has an amine backbone and that satisfies inequality (4) above. For example, of the hole-transporting materials described above, those having an amine backbone can be used, and benzidine-based amine derivatives are preferred.

Among benzidine-based amine derivatives, those having two or more naphthyl groups are preferred as the amine-based material used for the intermediate layer 7A. Such benzidine-based amine derivatives are exemplified by N,N'-bis(1-naphthyl)-N,N'-diphenyl-1,1'-biphenyl-4,4'-diamine (α-NPD), as represented by chemical formula 13 below, and N,N,N',N'-tetranaphthyl-benzidine (TNB), as represented by chemical formula 14 below:

Chemical Formula 13

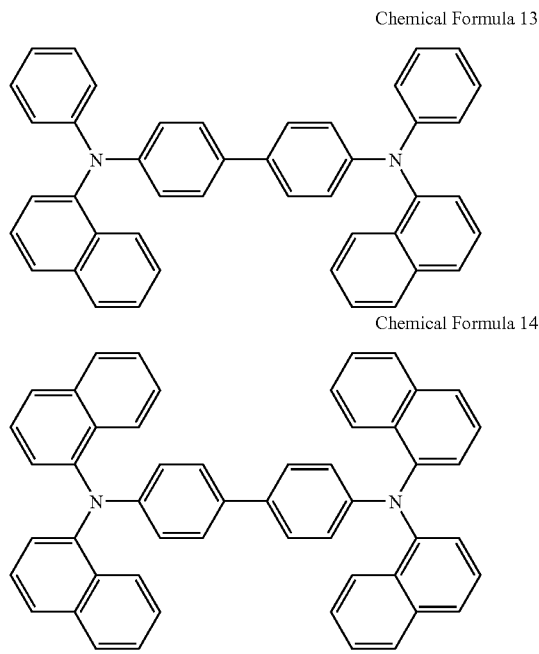

Chemical Formula 14

In general, such amine-based materials have high hole transportability, and their hole mobility is higher than that of acene-based material as described above. Hence, holes can be smoothly passed from the red light-emitting layer 6A to the blue light-emitting layer 8A through the intermediate layer 7A.

The content of the amine-based material in the intermediate layer 7A is preferably, but not limited to, 10% to 90% by weight, more preferably 30% to 70% by weight, and most preferably 40% to 60% by weight.

If the content of the first material in the intermediate layer 7A is A [wt %] and the content of the second material in the intermediate layer 7A is B [wt %], B/(A+B) is preferably 0.1 to 0.9, more preferably 0.3 to 0.7, and most preferably 0.4 to 0.6. In this case, carriers (electrons and holes) can be more favorably transported between the red light-emitting layer 6A and the blue light-emitting layer 8A through the intermediate layer 7A, and sufficient numbers of electrons and holes can be injected into the red light-emitting layer 6A and the blue light-emitting layer 8A to emit light.

The average thickness of the intermediate layer 7A is preferably, but not limited to, 1 to 100 nm, more preferably 3 to 50 nm, and most preferably 5 to 30 nm. In this case, electrons and holes can be more smoothly passed between the red light-emitting layer 6A and the blue light-emitting layer 8A through the intermediate layer 7A with a lower drive voltage, so that the light-emitting device 1A can emit light with sufficient luminance.

Blue Light-Emitting Layer

The blue light-emitting layer (second light-emitting layer) 8A contains a blue light-emitting material (second light-emitting layer) that emits light of blue color (second color) and the second host material, which supports the blue light-emitting material as a guest material.

The blue light-emitting material used is not specifically limited, and various blue fluorescent materials and blue phosphorescent materials can be used alone or in a combination of two or more.

The blue fluorescent material used can be any material that emits blue fluorescence. Examples of the blue fluorescent material used include distyryl derivatives, fluoranthene derivatives, pyrene derivatives, perylene and derivatives thereof, anthracene derivatives, benzoxazole derivatives, benzothiazole derivatives, benzimidazole derivatives, chrysene derivatives, phenanthrene derivatives, distyrylbenzene derivatives, tetraphenylbutadiene, 4,4'-bis(9-ethyl-3-carbazovinylene)-1,1'-biphenyl (BCzVBi), poly[(9,9-dioctylfluorene-2,7-diyl)-co-(2,5-dimethoxybenzene-1,4-diyl)], poly[(9,9-dihexyloxyfluorene-2,7-diyl)-alt-co-(2-methoxy-5-{2-ethoxyhexyloxy}phenylene-1,4-diyl)], and poly[(9,9-dioctylfluorene-2,7-diyl)-co-(ethynylbenzene)]. These materials can be used alone or in a combination of two or more.

The blue phosphorescent material used can be any material that emits blue phosphorescence. Examples of the blue phosphorescent material used include metal complexes such as iridium complexes, ruthenium complexes, platinum complexes, osmium complexes, rhenium complexes, and palladium complexes. Specific examples include bis[4,6-difluorophenylpyridinato-N,$C^{2'}$]-picolinate-iridium, tris[2-(2,4-difluorophenyl)pyridinato-N,$C^{2'}$]iridium, bis[2-(3,5-trifluoromethyl)pyridinato-N,$C^{2'}$]-picolinate-iridium, and bis(4,6-difluorophenylpyridinato-N,$C^{2'}$)iridium(acetylacetonate).

The second host material that can be used for the blue light-emitting layer 8A can be a host material similar to the first host material described above.

Green Light-Emitting Layer

The green light-emitting layer (third light-emitting layer) 9A contains a green light-emitting material (third light-emitting material) that emits light of green color (third color) and a third host material that supports the green light-emitting material as a guest material.

The green light-emitting material used is not specifically limited, and various green fluorescent materials and green phosphorescent materials can be used alone or in a combination of two or more.

The green fluorescent material used can be any material that emits green fluorescence. Examples of the green fluorescent material used include coumarin derivatives, quinacridone and derivatives thereof, 9,10-bis[(9-ethyl-3-carbazolyl)-vinylenyl]-anthracene, poly(9,9-dihexyl-2,7-vinylenefluorenylene), poly[(9,9-dioctylfluorene-2,7-diyl)-co-(1,4-diphenylene-vinylene-2-methoxy-5-{2-ethylhexyloxy}benzene)], and poly[(9,9-dioctyl-2,7-divinylenefluorenylene)-alt-co-(2-methoxy-5-(2-ethoxylhexyloxy)-1,4-phenylene)]. These materials can be used alone or in a combination of two or more.

The green phosphorescent material used can be any material that emits green phosphorescence. Examples of the green phosphorescent material used include metal complexes such as iridium complexes, ruthenium complexes, platinum complexes, osmium complexes, rhenium complexes, and palladium complexes. Of these metal complexes, those having at least one ligand with, for example, a phenylpyridine backbone, a bipyridyl backbone, or a porphyrin backbone are preferred. Specific examples include fac-tris(2-phenylpyridine)iridium (Ir(ppy)$_3$), bis(2-phenylpyridinato-N,$C^{2'}$)iridium(acetylacetonate), and fac-tris[5-fluoro-2-(5-trifluoromethyl-2-pyridinyl)phenyl-C,N]iridium.

The third host material that can be used for the green light-emitting layer 9A can be a host material similar to the first host material described above.

Electron-Transporting Layer

The electron-transporting layer 10A functions to transport electrons injected from the cathode 12A through the electron-injecting layer 11A to the green light-emitting layer 9A.

Examples of the material (electron-transporting material) of the electron-transporting layer 10A include quinoline derivatives (such as organometallic complexes having 8-quinolinol or its derivative as a ligand, for example, tris(8-quinolinolato)aluminum ($Alq_3$)), oxadiazole derivatives, perylene derivatives, pyridine derivatives, pyrimidine derivatives, quinoxaline derivatives, diphenylquinone derivatives, and nitro-substituted fluorene derivatives. These materials can be used alone or in a combination of two or more.

The average thickness of the electron-transporting layer 10A is preferably, but not limited to, about 0.5 to 100 nm, more preferably about 1 to 50 nm.

Electron-Injecting Layer

The electron-injecting layer 11A functions to improve the efficiency of electron injection from the cathode 12A.

Examples of the material (electron-injecting material) of the electron-injecting layer 11A include various inorganic insulating materials and various inorganic semiconductor materials.

Examples of inorganic insulating materials include alkali metal chalcogenides (oxides, sulfides, selenides, and tellurides), alkaline earth metal chalcogenides, alkali metal halides, and alkaline earth metal halides. These materials can be used alone or in a combination of two or more. These materials can be used as the main material of the electron-injecting layer 11A to improve its electron injectability. In particular, the light-emitting device 1A achieves high luminance if the electron-injecting layer 11A is formed of an alkali metal compound (such as an alkali metal chalcogenide or an alkali metal halide) because it has a very low work function.

Examples of alkali metal chalcogenides include $Li_2O$, LiO, $Na_2S$, $Na_2Se$, and NaO.

Examples of alkaline earth metal chalcogenides include CaO, BaO, SrO, BeO, BaS, MgO, and CaSe.

Examples of alkali metal halides include CsF, LiF, NaF, KF, LiCl, KCl, and NaCl.

Examples of alkaline earth metal halides include $CaF_2$, $BaF_2$, $SrF_2$, $MgF_2$, and $BeF_2$.

Examples of inorganic semiconductor materials include oxides, nitrides, and oxynitrides containing at least one element selected from the group consisting of lithium, sodium, barium, calcium, strontium, ytterbium, aluminum, gallium, indium, cadmium, magnesium, silicon, tantalum, antimony, and zinc. These materials can be used alone or in a combination of two or more.

The average thickness of the electron-injecting layer 11A is preferably, but not limited to, about 0.1 to 1,000 nm, more preferably about 0.2 to 100 nm, and most preferably about 0.2 to 50 nm.

Sealing Member

The sealing member 13A is disposed so as to cover and hermetically seal the anode 3A, the laminate 15A, and the cathode 12A, thus functioning to block oxygen and water. Disposing the sealing member 13A provides benefits such as improving the reliability of the light-emitting device 1A and preventing deterioration (improving durability).

Examples of the material of the sealing member 13A include aluminum, gold, chromium, niobium, tantalum, titanium, alloys thereof, silicon oxide, and various resin materials. If the sealing member 13A is formed of a conductive material, an insulating film is preferably provided as needed between the sealing member 13A and the anode 3A, the laminate 15A, and the cathode 12A to prevent a short circuit.

Alternatively, the sealing member 13A may be formed in a flat shape and disposed opposite the substrate 2A with the gap therebetween sealed with a sealant such as a thermosetting resin.

In the light-emitting device 1A thus configured, the intermediate layer 7A, containing the first and second materials, can transport electrons and holes between the red light-emitting layer 6A and the blue light-emitting layer 8A in a balanced manner, so that the red light-emitting layer 6A and the blue light-emitting layer 8A can each efficiently emit light. As a result, the light-emitting device 1A achieves high emission efficiency.

In this embodiment, particularly, the light of the second color has a shorter wavelength than the light of the first color. In such a case, a common light-emitting device has a problem in that it is difficult to achieve a good emission balance between individual light-emitting layers because light with a shorter wavelength is less easily emitted. In this embodiment, however, the intermediate layer 7A described above can concentrate electrons and holes in the layer that emits light with a shorter wavelength (in this embodiment, the blue light-emitting layer 8A). As a result, the individual light-emitting layers 6A, 8A, and 9A can emit light in a balanced manner, so that the light-emitting device 1A achieves high emission efficiency.

In this embodiment, additionally, the red light-emitting layer 6A, the intermediate layer 7A, the blue light-emitting layer 8A, and the green light-emitting layer 9A are arranged in the above order from the anode 3A to the cathode 12A. With this arrangement, it is relatively easy to allow the light-emitting device 1A to emit red (R) light, green (G) light, and blue (B) light in a balanced manner so that it can emit white light.

The light-emitting device 1 (1A) described above can be produced by, for example, the following process.

(1) First, the substrate 2 (2A) is prepared, and the anode 3 (3A) is formed on the substrate 2 (2A).

The anode 3 (3A) can be formed by, for example, dry plating such as chemical vapor deposition (CVD) (e.g., plasma-enhanced CVD or thermal CVD) or vacuum deposition; wet plating such as electroplating; spraying; the sol-gel process; metal-organic deposition (MOD); or bonding metal foil.

(2) Next, the hole-injecting layer 4 (4A) is formed on the anode 3 (3A).

The hole-injecting layer 4 (4A) can be formed by, for example, a vapor process based on dry plating such as CVD, vacuum deposition, or sputtering.

The hole-injecting layer 4 (4A) can also be formed by, for example, dissolving or dispersing a hole-injecting material in a solvent or dispersing medium, applying the material for forming the hole-injecting layer 4 (4A) onto the anode 3 (3A), and drying the material (removing the solvent or dispersing medium)

The material for forming the hole-injecting layer 4 (4A) can be applied by various coating methods such as spin coating, roll coating, or ink-jet printing. By such coating methods, the hole-injecting layer 4 (4A) can be formed relatively easily.

Examples of the solvent or dispersing medium used for the preparation of the material for forming the hole-injecting layer 4 (4A) include various inorganic solvents, various organic solvents, and mixed solvents thereof.

The drying can be performed, for example, by leaving the substrate 2 (2A) under atmospheric pressure or in a vacuum atmosphere, by heating, or by spraying inert gas.

Before the above step, the top surface of the anode 3 (3A) may be subjected to oxygen plasma treatment, for example, to make the top surface of the anode 3 (3A) lyophilic, to remove organic matter from (clean) the top surface of the anode 3 (3A), and to adjust the work function of the anode 3 (3A) near the top surface thereof.

The oxygen plasma treatment is preferably performed, for example, at a plasma power of about 100 to 800 W, an oxygen gas flow rate of about 50 to 100 mL/min, a workpiece (anode 3 (3A)) transportation speed of about 0.5 to 10 mm/sec, and a substrate temperature of about 70° C. to 90° C.

(3) Next, the hole-transporting layer 5 (5A) is formed on the hole-injecting layer 4 (4A).

The hole-transporting layer 5 (5A) can be formed by, for example, a vapor process based on dry plating such as CVD, vacuum deposition, or sputtering.

The hole-transporting layer 5 (5A) can also be formed by, for example, dissolving or dispersing a hole-transporting material in a solvent or dispersing medium, applying the material for forming the hole-transporting layer 5 (5A) onto the hole-injecting layer 4 (4A), and drying the material (removing the solvent or dispersing medium).

(4) Next, the red light-emitting layer 6 (6A) is formed on the hole-transporting layer 5 (5A).

The red light-emitting layer 6 (6A) can be formed by, for example, a vapor process based on dry plating such as CVD, vacuum deposition, or sputtering.

(5) Next, the intermediate layer 7 (7A) is formed on the red light-emitting layer 6 (6A).

The intermediate layer 7 (7A) can be formed by, for example, a vapor process based on dry plating such as CVD, vacuum deposition, or sputtering.

(6) Next, the blue light-emitting layer 8 (8A) is formed on the intermediate layer 7 (7A).

The blue light-emitting layer 8 (8A) can be formed by, for example, a vapor process based on dry plating such as CVD, vacuum deposition, or sputtering.

(7) Next, the green light-emitting layer 9 (9A) is formed on the blue light-emitting layer 8 (8A).

The green light-emitting layer 9 (9A) can be formed by, for example, a vapor process based on dry plating such as CVD, vacuum deposition, or sputtering.

(8) Next, the electron-transporting layer 10 (10A) is formed on the green light-emitting layer 9 (9A).

The electron-transporting layer 10 (10A) can be formed by, for example, a vapor process based on dry plating such as CVD, vacuum deposition, or sputtering.

The electron-transporting layer 10 (10A) can also be formed by, for example, dissolving or dispersing an electron-transporting material in a solvent or dispersing medium, applying the material for forming the electron-transporting layer 10 (10A) onto the green light-emitting layer 9 (9A), and drying the material (removing the solvent or dispersing medium).

(9) Next, the electron-injecting layer 11 (11A) is formed on the electron-transporting layer 10 (10A).

If the electron-injecting layer 11 (11A) is formed of an inorganic material, it can be formed by, for example, a vapor process based on dry plating such as CVD, vacuum deposition, or sputtering, or by applying and firing an inorganic microparticle ink.

(10) Next, the cathode 12 (12A) is formed on the electron-injecting layer 11 (11A).

The cathode 12 (12A) can be formed by, for example, vacuum deposition, sputtering, bonding metal foil, or applying and firing a metal microparticle ink.

Through the above process, the light-emitting device 1 (1A) is produced.

Finally, the sealing member 13 (13A) is placed on and bonded to the substrate 2 (2A) so as to cover the light-emitting device 1 (1A).

The light-emitting device 1 (1A) described above can be used as, for example, a light source. In addition, a plurality of light-emitting devices 1 (1A) can be arranged in a matrix to constitute a display (display apparatus).

The drive system for the display is not specifically limited and may be either an active-matrix system or a passive-matrix system.

Next, an example of a display serving as a display apparatus according to an embodiment of the invention will be described.

Figure 3:
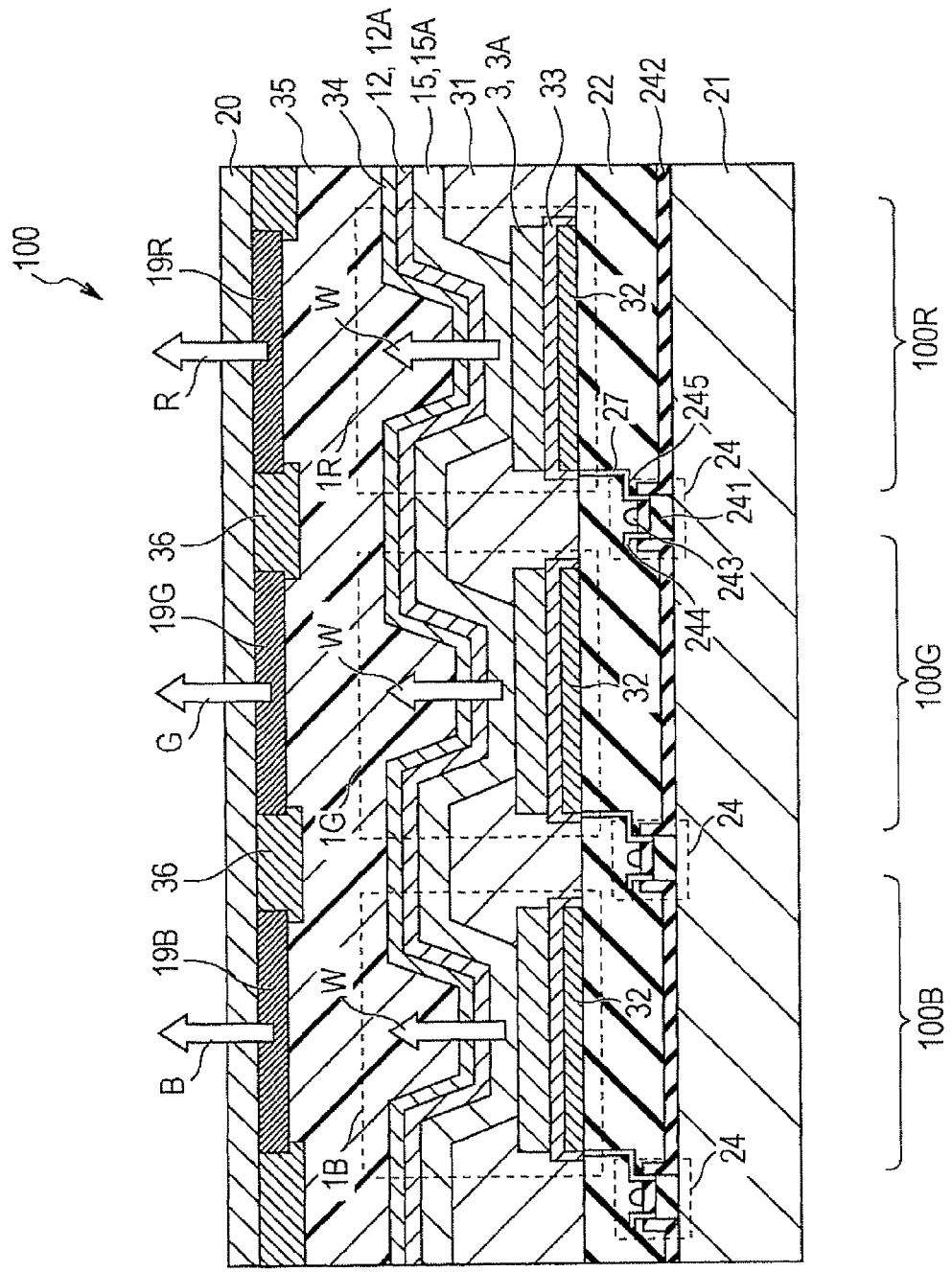
FIG. 3 is a longitudinal sectional view showing a display serving as a display apparatus according to an embodiment of the invention.

FIG. 3 is a longitudinal sectional view showing the display serving as the display apparatus according to the embodiment of the invention.

A display 100 shown in FIG. 3 includes a substrate 21; light-emitting devices 1R, 1G, and 1B corresponding to subpixels 100R, 100G, and 100B, respectively; color filters 19R, 19G, and 19B corresponding to the subpixels 100R, 100G, and 100B, respectively; and drive transistors 24 for driving the individual light-emitting devices 1R, 1G, and 1B. The display 100 is a top-emission display panel.

The drive transistors 24 are disposed on the substrate 21. A planarizing layer 22 formed of an insulating material is disposed over the drive transistors 24.

The drive transistors 24 each include a semiconductor layer 241 formed of silicon, a gap insulating layer 242 formed on the semiconductor layer 241, a gate electrode 243 formed on the gap insulating layer 242, a source electrode 244, and a drain electrode 245.

The light-emitting devices 1R, 1G, and 1B corresponding to the individual drive transistors 24 are disposed on the planarizing layer 22.

The light-emitting devices 1R are formed by stacking a reflective film 32, an anticorrosive film 33, an anode 3, a laminate (organic EL section) 15, a cathode 12, and a cathode cover 34 on the planarizing layer 22 in the above order. In this embodiment, the anodes 3 of the light-emitting devices 1R, 1G, and 1B constitute pixel electrodes and are electrically connected to the drain electrodes 245 of the drive transistors 24 via conductors (wiring lines) 27. The cathode 12 of the light-emitting devices 1R, 1G, and 1B constitutes a common electrode.

The light-emitting devices 1G and 1B have the same structure as the light-emitting devices 1R. In FIG. 3, the same components as in FIGS. 1 and 2 are indicated by the same reference numerals. The structure (properties) of the reflective film 32 may be different between the light-emitting devices 1R, 1G, and 1B depending on the wavelength of light.

A partition 31 is disposed between the adjacent light-emitting devices 1R, 1G, and 1B, and an epoxy layer 35 formed of epoxy resin is disposed over the light-emitting devices 1R, 1G, and 1B.

The color filters 19R, 19G, and 19B corresponding to the light-emitting devices 1R, 1G, and 1B, respectively, are disposed on the epoxy layer 35.

The color filters 19R convert white light W from the light-emitting devices 1R into red light. The color filters 19G convert white light W from the light-emitting devices 1G into green light. The color filters 19B convert white light W from the light-emitting devices 1B into blue light. The light-emitting devices 1R, 1G, and 1B can thus be used in combination with the color filters 19R, 19G, and 19B to display a full-color image.

A light-shielding layer 36 is disposed between the adjacent color filters 19R, 19G, and 19B. This light-shielding layer 36 can block unwanted light from the subpixels 100R, 100G, and 100B.

A sealing substrate 20 is disposed over the color filters 19R, 19G, and 19B and the light-shielding layer 36.

The display 100 described above may be configured as a monochrome display or as a color display by selecting the light-emitting materials used for the light-emitting devices 1R, 1G, and 1B.

The display 100 (display apparatus) can be incorporated in various electronic systems.

Figure 4:
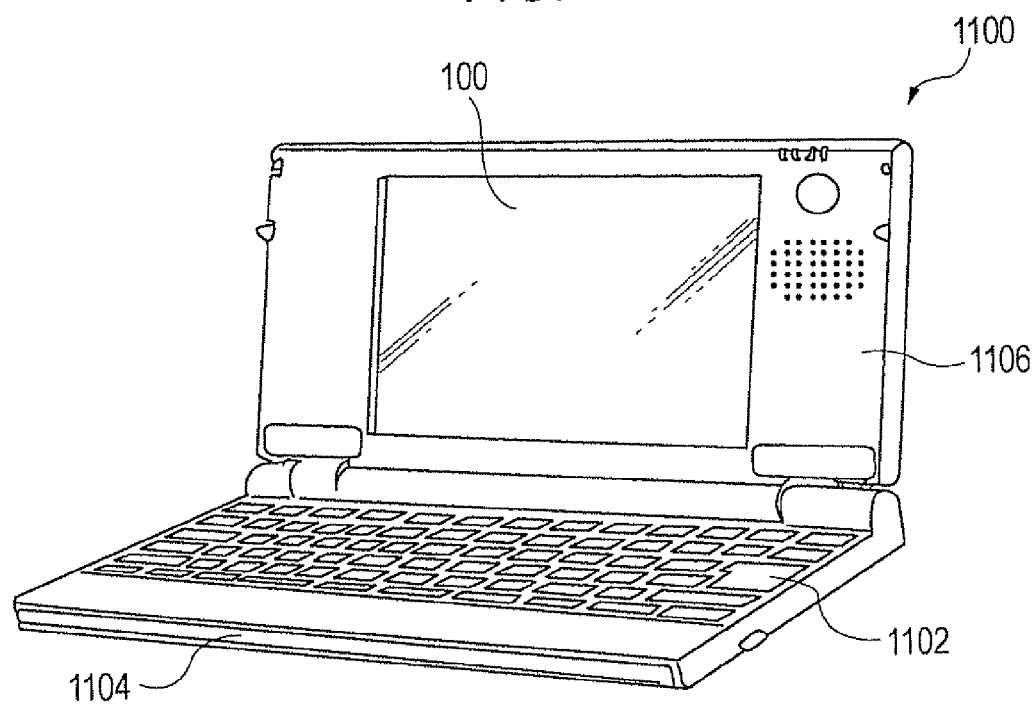
FIG. 4 is a perspective view showing a mobile (or notebook) personal computer serving as an electronic system according to an embodiment of the invention.

FIG. 4 is a perspective view showing a mobile (or notebook) personal computer serving as an electronic system according to an embodiment of the invention.

In FIG. 4, a personal computer 1100 includes a main body 1104 having a keyboard 1102 and a display unit 1106 having a display section. The display unit 1106 is supported so as to be rotatable relative to the main body 1104 about a hinge mechanism.

In the personal computer 1100, the display section of the display unit 1106 is constituted by the display 100 described above.

Figure 5:
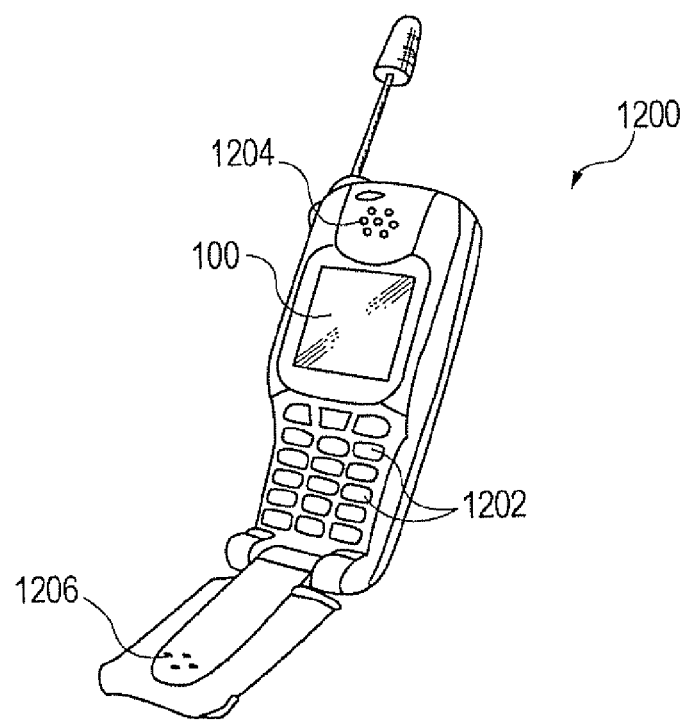
FIG. 5 is a perspective view showing a cellular phone (or PHS) serving as an electronic system according to an embodiment of the invention.

FIG. 5 is a perspective view showing a cellular phone (or PHS) serving as an electronic system according to an embodiment of the invention.

In FIG. 5, a cellular phone 1200 includes a plurality of operating buttons 1202, an earpiece 1204, a mouthpiece 1206, and a display section.

In the cellular phone 1200, the display section is constituted by the display 100 described above.

FIG. 6 is a perspective view showing a digital still camera serving as an electronic system according to an embodiment of the invention. In FIG. 6, connections to external devices are schematically shown.

While a traditional camera exposes a silver-salt photographic film to an optical image of a subject, a digital still camera 1300 photoelectrically converts an optical image of a subject into imaging signals (image signals) through an imaging device such as a charge-coupled device (CCD).

The digital still camera 1300 includes a display section on the rear of a case (body) 1302 to display an image based on the imaging signals generated by the imaging device. That is, the display section functions as a viewfinder for displaying the subject as an electronic image.

In the digital still camera 1300, the display section is constituted by the display 100 described above.

The case 1302 incorporates a circuit board 1308 on which a memory capable of storing the imaging signals is mounted.

The digital still camera 1300 also includes a light-receiving unit 1304 on the front of the case 1302 (on the backside in FIG. 6). The light-receiving unit 1304 includes, for example, an optical lens (imaging optical system) and the imaging device.

When the user presses a shutter button 1306 while seeing a subject image displayed on the display section, the imaging signals of the imaging device at that time are transmitted to and stored in the memory on the circuit board 1308.

The digital still camera 1300 also includes video-signal output terminals 1312 and a data-communication input/output terminal 1314 on one side of the case 1302. As shown, the video-signal output terminals 1312 are connected to a monitor 1430 as needed, whereas the data-communication input/output terminal 1314 is connected to a personal computer 1440 as needed. With a predetermined manipulation, the imaging signals can be fed from the memory on the circuit board 1308 to the monitor 1430 and the personal computer 1440.

In addition to the personal computer in FIG. 4 (mobile personal computer), the cellular phone in FIG. 5, and the digital still camera in FIG. 6, examples of electronic systems according to embodiments of the invention include televisions, video cameras, viewfinder-equipped or monitor-equipped camcorders, laptop personal computers, car navigation systems, pagers, electronic organizers (with or without communications capabilities), electronic dictionaries, calculators, electronic game machines, word processors, workstations, video phones, security monitors, electronic binoculars, POS terminals, touch-panel equipped devices (such as cash dispensers for financial institutions and automatic ticket machines), medical equipment (such as electronic thermometers, sphygmomanometers, blood glucose meters, electrocardiograph displays, ultrasonic diagnostic equipment, and displays for endoscopes), fish finders, a variety of measuring equipment, a variety of instruments (such as those used for cars, aircrafts, and ships), flight simulators, various other monitors, and projection displays such as projectors.

Although the light-emitting devices, display apparatuses, and electronic systems according to the embodiments of the invention have been described above with reference to the drawings, the invention is not limited thereto.

For example, although the light-emitting devices according to the above embodiments include three light-emitting layers, they may include two or four or more light-emitting layers. In addition, the colors of light of the light-emitting layers are not limited to those used in the above embodiments, namely, red, green, and blue. Even if two or four or more light-emitting layers are provided, white light can be emitted by appropriately adjusting the emission spectra of the light-emitting layers.

Furthermore, an intermediate layer may be provided in at least one of the interfaces between the light-emitting layers, and two or more intermediate layers may be provided.

EXAMPLES

Next, specific examples of the invention will be described.
1. Production of Light-Emitting Device Example 1

(1) First, a transparent glass substrate with an average thickness of 0.5 mm was prepared. Next, an ITO electrode (anode) with an average thickness of 50 nm was formed on the substrate by sputtering.

The substrate was subjected to ultrasonic cleaning in acetone and then in 2-propanol and was subjected to oxygen plasma treatment.

(2) Next, a hole-injecting layer with an average thickness of 30 nm was formed on the ITO electrode by depositing LG101 (manufactured by LG Chem, Ltd.) through vacuum deposition.

(3) Next, a hole-transporting layer with an average thickness of 20 nm was formed on the hole-injecting layer by depositing N,N'-bis(1-naphthyl)-N,N'-diphenyl-1,1'-biphenyl-4,4'-diamine (α-NPD), represented by chemical formula 6 above, through vacuum deposition.

(4) Next, a red light-emitting layer (first light-emitting layer) with an average thickness of 10 nm was formed on the hole-transporting layer by depositing the constituent materials of the red light-emitting layer through vacuum deposition. As for the constituent materials of the red light-emitting layer, the tetraaryldiindenoperylene derivative (RD-1) represented by chemical formula 1 above was used as a red light-emitting material (guest material), and rubrene (RB) was used as a host material. The content (dosage) of the red light-emitting material (dopant) in the red light-emitting layer was 1.5% by weight.

(5) Next, an intermediate layer with an average thickness of 15 nm was formed on the red light-emitting layer by depositing the constituent materials of the intermediate layer through vacuum deposition. As for the constituent materials of the intermediate layer, α,α-MADN (acene-based material), represented by chemical formula 5 above, was used as a first material, and α-NPD (amine-based material), represented by chemical formula 6 above, was used as a second material. The content of the first material in the intermediate layer was 50% by weight, whereas the content of the second material in the intermediate layer was 50% by weight.

(6) Next, a blue light-emitting layer (second light-emitting layer) with an average thickness of 10 nm was formed on the intermediate layer by depositing the constituent materials of the blue light-emitting layer through vacuum deposition. As for the constituent materials of the blue light-emitting layer, BD102 (manufactured by Idemitsu Kosan Co., Ltd.) was used as a blue light-emitting material (guest material), and 2-t-butyl-9,10-di(2-naphthyl)anthracene (TBADN) was used as a host material. The content (dosage) of the blue light-emitting material (dopant) in the blue light-emitting layer was 9.0% by weight.

(7) Next, a green light-emitting layer (third light-emitting layer) with an average thickness of 20 nm was formed on the blue light-emitting layer by depositing the constituent materials of the green light-emitting layer through vacuum deposition. As for the constituent materials of the green light-emitting layer, quinacridone was used as a green light-emitting material (guest material), and tris(8-quinolinolato)aluminum (Alq$_3$) was used as a host material. The content (dosage) of the green light-emitting material (dopant) in the green light-emitting layer was 3.0% by weight.

(8) Next, an electron-transporting layer with an average thickness of 20 nm was formed on the green light-emitting layer by depositing tris(8-quinolinolato)aluminum (Alq$_3$) through vacuum deposition.

(9) Next, an electron-injecting layer with an average thickness of 1 nm was formed on the electron-transporting layer by depositing lithium fluoride (LiF) through vacuum deposition.

(10) Next, a cathode with an average thickness of 200 nm was formed on the electron-injecting layer by depositing aluminum through vacuum deposition.

(11) Next, a glass protective cover (sealing member) was placed over the layers and was fixed and sealed with epoxy resin.

Through the above process, light-emitting devices as shown in FIG. 1 were produced.

Example 2

Light-emitting devices were produced in the same manner as in Example 1 except that the intermediate layer was formed using TBADN, represented by chemical formula 3 above, as the first material.

Comparative Example 1

Light-emitting devices were produced in the same manner as in Example 1 except that the intermediate layer was formed using 2-methyl-9,10-di(2-naphthyl)anthracene (MADN), represented by chemical formula 4 above, as the first material.

2. Evaluation of Radiance (Emission Efficiency)

The radiance (initial radiance) of the light-emitting devices of Examples 1 and 2 and Comparative Example 1 was measured using a radiance meter by supplying a constant current of 18 mA/cm$^2$ from a DC power supply. The radiance measurement was performed on five light-emitting devices for each of Examples 1 and 2 and Comparative Example 1. The reason for selecting radiance was to evaluate emission intensity irrespective of the shapes of emission spectra.

Table 1 shows the host materials of the red and blue light-emitting layers, the composition and HOMO and LUMO energy levels of the intermediate layer, and the results of the radiance evaluation for Examples 1 and 2 and Comparative Example 1. In Table 1, X1 to X3 and Y1 to Y3 are values determined by the following equations:

$$X1 = LL_A - LL_B$$

$$X2 = |LL_D - LL_B|$$

$$X3 = |LL_A - LL_D|$$

$$Y1 = |HL_A - HL_C| - |HL_B - HL_C|$$

$$Y2 = |HL_A - HL_C|$$

$$Y3 = |HL_B - HL_C|$$

TABLE 1

| | Red light-emitting layer | | Intermediate layer | | | | | | Blue light-emitting layer | | | | | | | | Radiance |
|---|---|---|---|---|---|---|---|---|---|---|---|---|---|---|---|---|---|
| | First host material | $HL_C$ [eV] | First material | $HL_A$ [eV] | $LL_A$ [eV] | Second material | $HL_B$ [eV] | $LL_B$ [eV] | Second host material | $LL_D$ [eV] | X1 | X2 | X3 | Y1 | Y2 | Y3 | [W/(m2·sr)] |
| Example 1 | RB | 5.4 | α,α-MADN | 5.8 | 2.8 | αNPD | 5.5 | 2.4 | TBADN | 2.9 | 0.4 | 0.5 | 0.1 | 0.3 | 0.4 | 0.1 | 2.22 |
| Example 2 | RB | 5.4 | TBADN | 5.8 | 2.9 | αNPD | 5.5 | 2.4 | TBADN | 2.9 | 0.5 | 0.5 | 0 | 0.3 | 0.4 | 0.1 | 2.20 |
| Comparative Example 1 | RB | 5.4 | MADN | 5.6 | 2.6 | αNPD | 5.5 | 2.4 | TBADN | 2.9 | 0.2 | 0.5 | 0.3 | 0.1 | 0.2 | 0.1 | 2.05 |

As is obvious from Table 1, the light-emitting devices of Examples 1 and 2 had higher radiances at a predetermined current than those of Comparative Example 1. That is, the light-emitting devices of Examples 1 and 2 had high emission efficiency.

3. Production of Light-Emitting Device

Example 3

(1) First, a transparent glass substrate with an average thickness of 0.5 mm was prepared. Next, an ITO electrode (anode) with an average thickness of 50 nm was formed on the substrate by sputtering.

The substrate was subjected to ultrasonic cleaning in acetone and then in 2-propanol and was subjected to oxygen plasma treatment.

(2) Next, a hole-injecting layer with an average thickness of 30 nm was formed on the ITO electrode by depositing LG101 (manufactured by LG Chem, Ltd.) through vacuum deposition.

(3) Next, a hole-transporting layer with an average thickness of 20 nm was formed on the hole-injecting layer by depositing N,N'-bis(1-naphthyl)-N,N'-diphenyl-1,1'-biphenyl-4,4'-diamine ($\alpha$-NPD), represented by chemical formula 13 above, through vacuum deposition.

(4) Next, a red light-emitting layer (first light-emitting layer) with an average thickness of 10 nm was formed on the hole-transporting layer by depositing the constituent materials of the red light-emitting layer through vacuum deposition. As for the constituent materials of the red light-emitting layer, the tetraaryldiindenoperylene derivative (RD-1) represented by chemical formula 8 above was used as a red light-emitting material (guest material), and rubrene (RB) was used as a host material. The content (dosage) of the red light-emitting material (dopant) in the red light-emitting layer was 1.5% by weight.

(5) Next, an intermediate layer with an average thickness of 15 nm was formed on the red light-emitting layer by depositing the constituent materials of the intermediate layer through vacuum deposition. As for the constituent materials of the intermediate layer, $\alpha,\alpha$-MADN (acene-based material), represented by chemical formula 12 above, was used as a first material, and $\alpha$-NPD (amine-based material), represented by chemical formula 13 above, was used as a second material. The content of the first material in the intermediate layer was 50% by weight, whereas the content of the second material in the intermediate layer was 50% by weight.

(6) Next, a blue light-emitting layer (second light-emitting layer) with an average thickness of 10 nm was formed on the intermediate layer by depositing the constituent materials of the blue light-emitting layer through vacuum deposition. As for the constituent materials of the blue light-emitting layer, BD102 (manufactured by Idemitsu Kosan Co., Ltd.) was used as a blue light-emitting material (guest material), and 2-t-butyl-9,10-di(2-naphthyl)anthracene (TBADN) was used as a host material. The content (dosage) of the blue light-emitting material (dopant) in the blue light-emitting layer was 9.0% by weight.

(7) Next, a green light-emitting layer (third light-emitting layer) with an average thickness of 30 nm was formed on the blue light-emitting layer by depositing the constituent materials of the green light-emitting layer through vacuum deposition. As for the constituent materials of the green light-emitting layer, quinacridone was used as a green light-emitting material (guest material), and tris(8-quinolinolato)aluminum ($Alq_3$) was used as a host material. The content (dosage) of the green light-emitting material (dopant) in the green light-emitting layer was 3.0% by weight.

(8) Next, an electron-transporting layer with an average thickness of 20 nm was formed on the green light-emitting layer by depositing tris(8-quinolinolato)aluminum ($Alq_3$) through vacuum deposition.

(9) Next, an electron-injecting layer with an average thickness of 1 nm was formed on the electron-transporting layer by depositing lithium fluoride (LiF) through vacuum deposition.

(10) Next, a cathode with an average thickness of 200 nm was formed on the electron-injecting layer by depositing aluminum through vacuum deposition.

(11) Next, a glass protective cover (sealing member) was placed over the layers and was fixed and sealed with epoxy resin.

Through the above process, light-emitting devices as shown in FIG. 2 were produced.

Example 4

Light-emitting devices were produced in the same manner as in Example 3 except that the intermediate layer was formed using TBADN (acene-based material), represented by chemical formula 10 above, as the first material.

Comparative Example 2

Light-emitting devices were produced in the same manner as in Example 3 except that the intermediate layer was formed using 2-methyl-9,10-di(2-naphthyl)anthracene (MADN), represented by chemical formula 11 above, as the first material.

4. Evaluation of Radiance (Emission Efficiency)

The radiance (initial radiance) of the light-emitting devices of Examples 3 and 4 and Comparative Example 2 was measured using a radiance meter by supplying a constant current of 18 mA/cm² from a DC power supply. The radiance measurement was performed on five light-emitting devices for each of Examples 3 and 4 and Comparative Example 2. The reason for selecting radiance was to evaluate emission intensity irrespective of the shapes of emission spectra.

Table 2 shows the host materials of the red and blue light-emitting layers, the composition and HOMO and LUMO energy levels of the intermediate layer, and the results of the radiance evaluation for Examples 3 and 4 and Comparative Example 2. In Table 1, W1 to W3 and Z1 and Z2 are values determined by the following equations:

$$W1 = |HL_A - HL_C| - |HL_B - HL_C|$$

$$W2 = |HL_A - HL_C|$$

$$W3 = |HL_B - HL_C|$$

$$Z1 = LL_A - LL_B$$

$$Z2 = |LL_A - LL_D|$$

TABLE 2

| | Red light-emitting layer | | Intermediate layer | | | | | Blue light-emitting layer | | | | | | | Radiance |
|---|---|---|---|---|---|---|---|---|---|---|---|---|---|---|---|
| | First host material | $HL_C$ [eV] | First material | $HL_A$ [eV] | $LL_A$ [eV] | Second material | $HL_B$ [eV] | $LL_B$ [eV] | Second host material | $LL_D$ [eV] | W1 | W2 | W3 | Z1 | Z2 | [W/(m²·SR)] |
| Example 3 | RB | 5.4 | α,α-MADN | 5.8 | 2.8 | αNPD | 5.5 | 2.4 | TBADN | 2.9 | 0.3 | 0.4 | 0.1 | 0.4 | 0.1 | 2.22 |
| Example 4 | RB | 5.4 | TBADN | 5.8 | 2.9 | αNPD | 5.5 | 2.4 | TBADN | 2.9 | 0.3 | 0.4 | 0.1 | 0.5 | 0 | 2.20 |
| Comparative Example 2 | RB | 5.4 | MADN | 5.6 | 2.6 | αNPD | 5.5 | 2.4 | TBADN | 2.9 | 0.1 | 0.2 | 0.1 | 0.2 | 0.3 | 2.05 |

As is obvious from Table 2, the light-emitting devices of Examples 3 and 4 had higher radiances at a predetermined current than those of Comparative Example 2, which serves as a reference. That is, the light-emitting devices of Examples 3 and 4 had high emission efficiency.

The entire disclosure of Japanese Patent Application No. 2008-145169 and No. 2008-145170, filed Jun. 16, 2008 are expressly incorporated by reference herein.

What is claimed is:

1. A light-emitting device comprising:
a cathode;
an anode;
a first light-emitting layer that is disposed between the cathode and the anode and that emits light of a first color;
a second light-emitting layer that is disposed between the first light-emitting layer and the cathode and that emits light of a second color different from the first color; and
an intermediate layer that is disposed between and in contact with the first light-emitting layer and the second light-emitting layer and that contains a first material and a second material different from the first material;
wherein the light-emitting device satisfies inequality (1):

$$LL_A - LL_B \geq 0.4 [eV] \qquad (1)$$

wherein $LL_A$ [eV] is the energy level of the lowest unoccupied molecular orbital of the first material, and $LL_B$ [eV] is the energy level of the lowest unoccupied molecular orbital of the second material.

2. The light-emitting device according to claim 1, wherein the second light-emitting layer contains a light-emitting material and a host material that supports the light-emitting material; and
the light-emitting device satisfies inequality (2):

$$LL_D - LL_B \geq 0.3 [eV] \qquad (2)$$

wherein $LL_D$ [eV] is the energy level of the lowest unoccupied molecular orbital of the host material.

3. The light-emitting device according to claim 1, wherein the second light-emitting layer contains a light-emitting material and a host material that supports the light-emitting material; and
the light-emitting device satisfies inequality (3):

$$|LL_A - LL_D| \leq 0.2 [eV] \qquad (3)$$

wherein $LL_D$ [eV] is the energy level of the lowest unoccupied molecular orbital of the host material.

4. The light-emitting device according to claim 1, wherein the light of the second color has a shorter wavelength than the light of the first color.

5. The light-emitting device according to claim 1, wherein the first material has a higher electron mobility than the second material.

6. The light-emitting device according to claim 1, further comprising a third light-emitting layer that is disposed between the first light-emitting layer and the anode or between the second light-emitting layer and the cathode and that emits light of a third color different from the first and second colors.

7. A display apparatus comprising the light-emitting device according to claim 1.

8. An electronic system comprising the display apparatus according to claim 7.

9. A light-emitting device comprising:
a cathode;
an anode;
a first light-emitting layer that is disposed between the cathode and the anode and that emits light of a first color, the first light-emitting layer containing a first light-emitting material that emits the light of the first color and a first host material that supports the first light-emitting material as a guest material;
a second light-emitting layer that is disposed between the first light-emitting layer and the cathode and that emits light of a second color different from the first color; and
an intermediate layer that is disposed between and in contact with the first light-emitting layer and the second light-emitting layer and that contains a first material and a second material having a higher hole mobility than the first material;
wherein the light-emitting device satisfies inequalities (4) and (5):

$$|HL_B - HL_C| < |HL_A - HL_C| \qquad (4)$$

$$|HL_A - HL_C| \geq 0.3 [eV] \qquad (5)$$

wherein $HL_A$ [eV] is the energy level of the highest occupied molecular orbital of the first material, $HL_B$ [eV] is the energy level of the highest occupied molecular orbital of the second material, and $HL_C$ [eV] is the energy level of the highest occupied molecular orbital of the first host material.

10. The light-emitting device according to claim 9, wherein the second material and the first host material satisfy inequality (6):

$$|HL_B - HL_C| \leq 0.2 [eV] \qquad (6).$$

11. The light-emitting device according to claim 9, wherein the first material has a higher electron mobility than the second material.

12. The light-emitting device according to claim 9, wherein the light of the second color has a shorter wavelength than the light of the first color.

13. The light-emitting device according to claim 9, wherein the light-emitting device satisfies inequality (7):

$$LL_A - LL_B \geqq 0.4 [eV] \quad (7)$$

wherein $LL_A$ [eV] is the energy level of the lowest unoccupied molecular orbital of the first material, and $LL_B$ [eV] is the energy level of the lowest unoccupied molecular orbital of the second material.

14. The light-emitting device according to claim 9, wherein the second light-emitting layer contains a second light-emitting material that emits the light of the second color and a second host material that supports the second light-emitting material; and
the light-emitting device satisfies inequality (8):

$$|LL_A - LL_D| \leqq 0.2 [eV] \quad (8)$$

wherein $LL_A$ [eV] is the energy level of the lowest unoccupied molecular orbital of the first material, and $LL_D$ [eV] is the energy level of the lowest unoccupied molecular orbital of the second host material.

15. The light-emitting device according to claim 9, further comprising a third light-emitting layer that is disposed between the first light-emitting layer and the anode or between the second light-emitting layer and the cathode and that emits light of a third color different from the first and second colors.

16. A display apparatus comprising the light-emitting device according to claim 9.

17. An electronic system comprising the display apparatus according to claim 16.

* * * * *